(12) United States Patent
Oh et al.

(10) Patent No.: US 11,664,348 B2
(45) Date of Patent: May 30, 2023

(54) SUBSTRATE ASSEMBLY SEMICONDUCTOR PACKAGE INCLUDING THE SAME AND METHOD OF MANUFACTURING 1HE SEMICONDUCTOR PACKAGE

(71) Applicant: Samsung Electronics Co., Ltd., Suwon-si (KR)

(72) Inventors: Kyung Suk Oh, Seongnam-si (KR); Do-Hyun Kim, Asan-si (KR); Sunwon Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 17/094,267

(22) Filed: Nov. 10, 2020

(65) Prior Publication Data
US 2021/0057388 A1 Feb. 25, 2021

Related U.S. Application Data

(62) Division of application No. 16/385,363, filed on Apr. 16, 2019, now Pat. No. 10,861,826.

(30) Foreign Application Priority Data

Sep. 4, 2018 (KR) .......................... 10-2018-0105380

(51) Int. Cl.
*H01L 23/48* (2006.01)
*H01L 23/52* (2006.01)
(Continued)

(52) U.S. Cl.
CPC .......... *H01L 25/0657* (2013.01); *H01L 25/50* (2013.01); *H01L 2225/06506* (2013.01);
(Continued)

(58) Field of Classification Search
CPC ... H01L 24/32; H01L 25/105; H01L 25/0657; H01L 25/50; H01L 2225/06541;
(Continued)

(56) References Cited

U.S. PATENT DOCUMENTS

| 8,552,546 | B2 | 10/2013 | Song et al. |
| 8,772,084 | B2 | 7/2014 | Lee et al. |
| 9,202,716 | B2 | 12/2015 | Park et al. |
| 9,484,322 | B1 | 11/2016 | Jeong |

(Continued)

FOREIGN PATENT DOCUMENTS

| CN | 103165505 B | 5/2017 |
| CN | 108028233 A | 5/2018 |

(Continued)

*Primary Examiner* — Theresa T Doan
(74) *Attorney, Agent, or Firm* — Muir Patent Law, PLLC

(57) ABSTRACT

A semiconductor package includes a substrate, a first semiconductor chip on the substrate, a second semiconductor chip on the first semiconductor chip and a connection structure. The second semiconductor chip includes a first segment that protrudes outwardly beyond one side of the first semiconductor chip and a second connection pad on a bottom surface of the first segment of the second semiconductor chip. The connection structure includes a first structure between the substrate and the first segment of the second semiconductor chip and a first columnar conductor penetrating the first structure to be in contact with the substrate and being disposed between the second connection pad and the substrate, thereby electrically connecting the second semiconductor chip to the substrate.

19 Claims, 23 Drawing Sheets

(51) Int. Cl.
*H01L 25/065* (2023.01)
*H01L 25/00* (2006.01)

(52) U.S. Cl.
CPC ........... *H01L 2225/06513* (2013.01); *H01L 2225/06524* (2013.01); *H01L 2225/06548* (2013.01); *H01L 2225/06562* (2013.01); *H01L 2225/06586* (2013.01)

(58) Field of Classification Search
CPC . H01L 2225/06562; H01L 2225/06568; H01L 2225/06517; H01L 2225/1035; H01L 23/3171; H01L 23/5384; H01L 24/94; H01L 2225/0652; H01L 2225/06565; H01L 23/49833; H01L 23/5226; H01L 2225/06555; H01L 25/074; H01L 25/117
USPC ............................................ 257/738
See application file for complete search history.

(56) References Cited

U.S. PATENT DOCUMENTS

| | | | |
|---|---|---|---|
| 9,576,849 | B2 | 2/2017 | Lee |
| 9,640,515 | B2 | 5/2017 | Zohni et al. |
| 9,716,080 | B1 | 7/2017 | Chuang et al. |
| 9,899,354 | B2 | 2/2018 | Zhao |
| 10,748,873 | B2 | 8/2020 | Guo et al. |
| 2010/0193930 | A1 | 8/2010 | Lee |
| 2015/0200182 | A1* | 7/2015 | Wang ............... H01L 25/50 257/774 |
| 2017/0278821 | A1 | 9/2017 | Zhao et al. |
| 2018/0145061 | A1* | 5/2018 | Jeong ............... H01L 23/5385 |

FOREIGN PATENT DOCUMENTS

| KR | 1020100088514 A | 8/2010 |
|---|---|---|
| KR | 10-2013-0032187 A | 4/2013 |
| KR | 10-2016-0149905 A | 12/2016 |

\* cited by examiner

SUBSTRATE ASSEMBLY SEMICONDUCTOR PACKAGE INCLUDING THE SAME AND METHOD OF MANUFACTURING 1HE SEMICONDUCTOR PACKAGE

CROSS-REFERENCE TO RELATED APPLICATION

This U.S. nonprovisional application is a divisional of and claims priority to U.S. patent application Ser. No. 16/385,363 filed on Apr. 16, 2019, which claims priority under 35 U.S.C § 119 to Korean Patent Application No. 10-2018-0105380, filed on Sep. 4, 2018 in the Korean Intellectual Property Office, the entire contents of each of which are hereby incorporated by reference.

BACKGROUND

The present inventive concepts relate to a substrate assembly, a semiconductor package including the same, and a method of manufacturing the semiconductor package.

With the development of electronic industry, electronic products demand a high performance operation at a compact size. To meet such demand, semiconductor chips are stacked on a substrate or a package is stacked on another package.

It may be required that semiconductor chips stacked on a substrate be connected to the substrate using a various methods such as bonding wires. Alternatively, each of the semiconductor chips is perforated to form holes in which a through silicon vias (TSVs) may be provided to connect an upper chip to the substrate or to a lower chip.

SUMMARY

According to an exemplary embodiment of the present inventive concept, a semiconductor package includes a substrate, a first semiconductor chip on the substrate, a second semiconductor chip on the first semiconductor chip and a connection structure. The second semiconductor chip includes a first segment that protrudes outwardly beyond one side of the first semiconductor chip and a second connection pad on a bottom surface of the first segment of the second semiconductor chip. The connection structure includes a first structure between the substrate and the first segment of the second semiconductor chip and a first columnar conductor penetrating the first structure to be in contact with the substrate and being disposed between the second connection pad and the substrate, thereby electrically connecting the second semiconductor chip to the substrate.

According to an exemplary embodiment of the present inventive concept, a substrate assembly includes a substrate and a connection structure assembled on a top surface of the substrate. The connection structure comprises a first structure that extends upwardly from the substrate and a first columnar conductor penetrating the first structure to be in contact with the substrate.

According to an exemplary embodiment of the present inventive concept, a method of manufacturing a semiconductor package includes preparing a substrate provided with a columnar conductor, stacking semiconductor chips on the substrate such that at least one of the semiconductor chips is electrically connected to the substrate via the columnar conductor and the semiconductor chips are disposed outside the columnar conductor. The columnar conductor extends upwardly from the substrate.

DETAILED DESCRIPTION OF EXEMPLARY EMBODIMENTS

Figure 1:
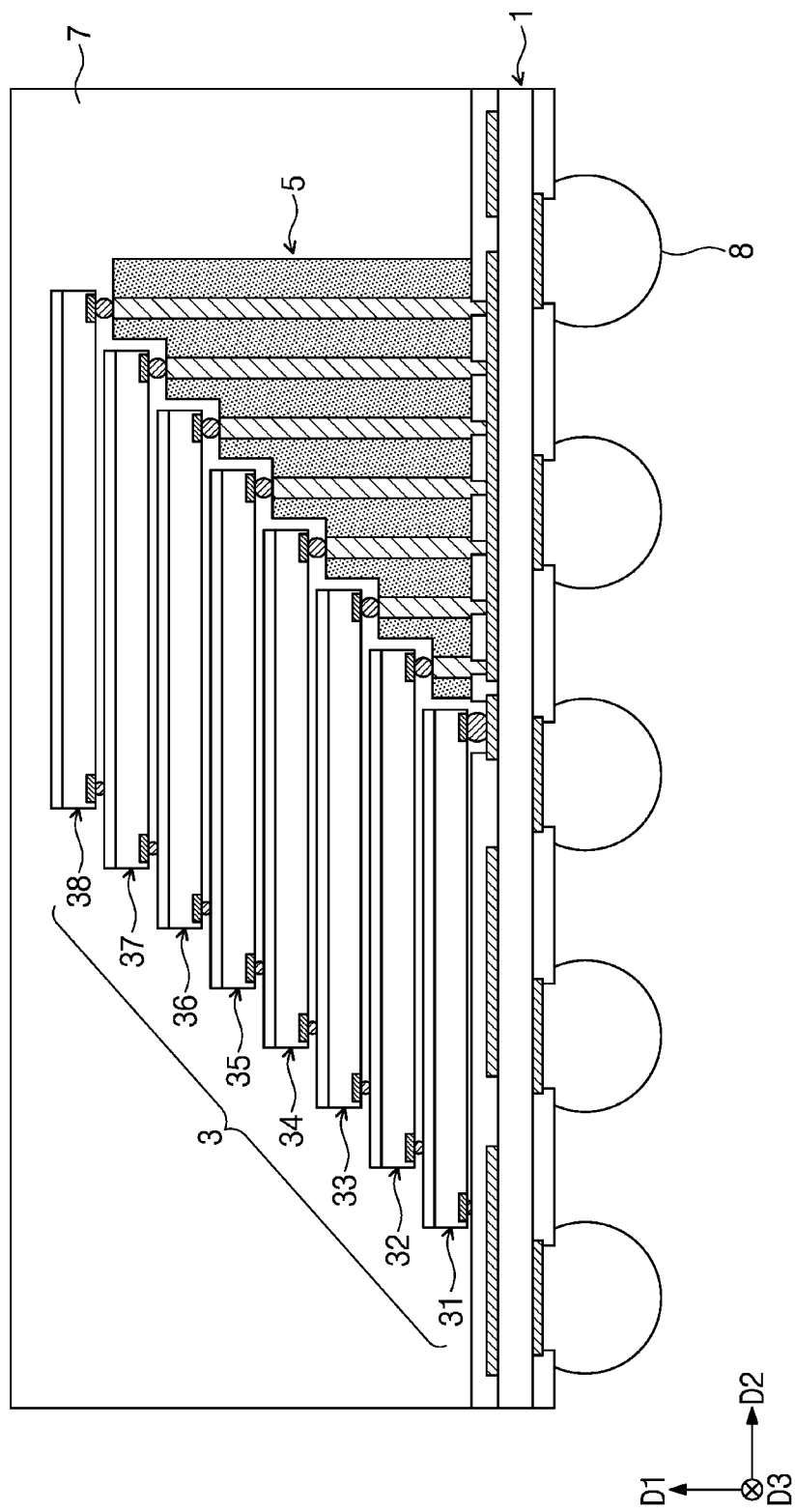
FIG. 1 illustrates a cross-sectional view showing a semiconductor package according to some example embodiments of the present inventive concepts.

The following will now describe some example embodiments of the present inventive concepts with reference to the accompanying drawings. Like reference numerals may indicate like components throughout the description.

FIG. 1 illustrates a cross-sectional view showing a semiconductor package according to some example embodiments of the present inventive concepts.

FIG. 1 shows a direction D1 as a first direction, a direction D2 as a second direction, and a direction D3 as a third direction. An upward direction may indicate the first direction D1, a downward direction may indicate a direction opposite to the first direction D1, a right side may be directed to the second direction D2, and a left side may be directed to a direction opposite to the second direction D2.

Referring to FIG. 1, a semiconductor package may include a substrate 1, semiconductor chips 3, a connection structure 5, a molding layer 7, and external connection terminals 8. For example, the external connection terminals 8 may include external balls.

The substrate 1 may be electrically connected to the semiconductor chips 3. The substrate 1 may be a printed circuit board (PCB). For example, the substrate 1 may be a wafer. The substrate 1 may be differently configured for electrical connection with the semiconductor chips 3.

The semiconductor chips 3 may be stacked on the substrate 1. Two or more semiconductor chips 3 may be provided. FIG. 1 shows an example including a first semiconductor chip 31, a second semiconductor chip 32, a third semiconductor chip 33, a fourth semiconductor chip 34, a fifth semiconductor chip 35, a sixth semiconductor chip 36, a seventh semiconductor chip 37, and an eighth semiconductor chip 38. The present inventive concepts, however, are not limited to the above-mentioned example. For example, the semiconductor chips 3 may only include the first semiconductor chip 31 and the second semiconductor chip 32, or may include nine or more semiconductor chips. Each of the semiconductor chips 3 may be a logic chip, a memory chip, or the like.

The semiconductor chips 3 may each have the same area. Alternatively, at least one of the semiconductor chips 3 may have a different area from the others. The semiconductor chips 3 may be identical chips. Alternatively, at least one of the semiconductor chips 3 may have different characteristics from the others (e.g., different type, different size, different operation, etc.).

The connection structure 5 may electrically connect the substrate 1 to one, some, or all of the semiconductor chips 3. The connection structure 5 may support one, some, or all of the semiconductor chips 3.

The molding layer 7 may encapsulate the semiconductor chips 3. The molding layer 7 may protect the semiconductor chips 3 from the external environment. For example, the molding layer 7 may protect the semiconductor chips 3 from external heat, moisture, or impact. The molding layer 7 may outwardly discharge heat generated from the semiconductor chips 3 and/or the substrate 1. The molding layer 7 may include, for example, an epoxy molding compound (EMC). Alternatively, the molding layer 7 may include a dielectric material other than the epoxy molding compound (EMC).

The external connection terminals 8 may be attached to a bottom surface of the substrate 1. The external connection terminals 8 may electrically connect the substrate 1 to a package, board, or the like external to the semiconductor package.

The substrate 1, the semiconductor chips 3, the connection structure 5, the molding layer 7, and the external connection terminals 8 will be further discussed in detail below.

Figure 2:
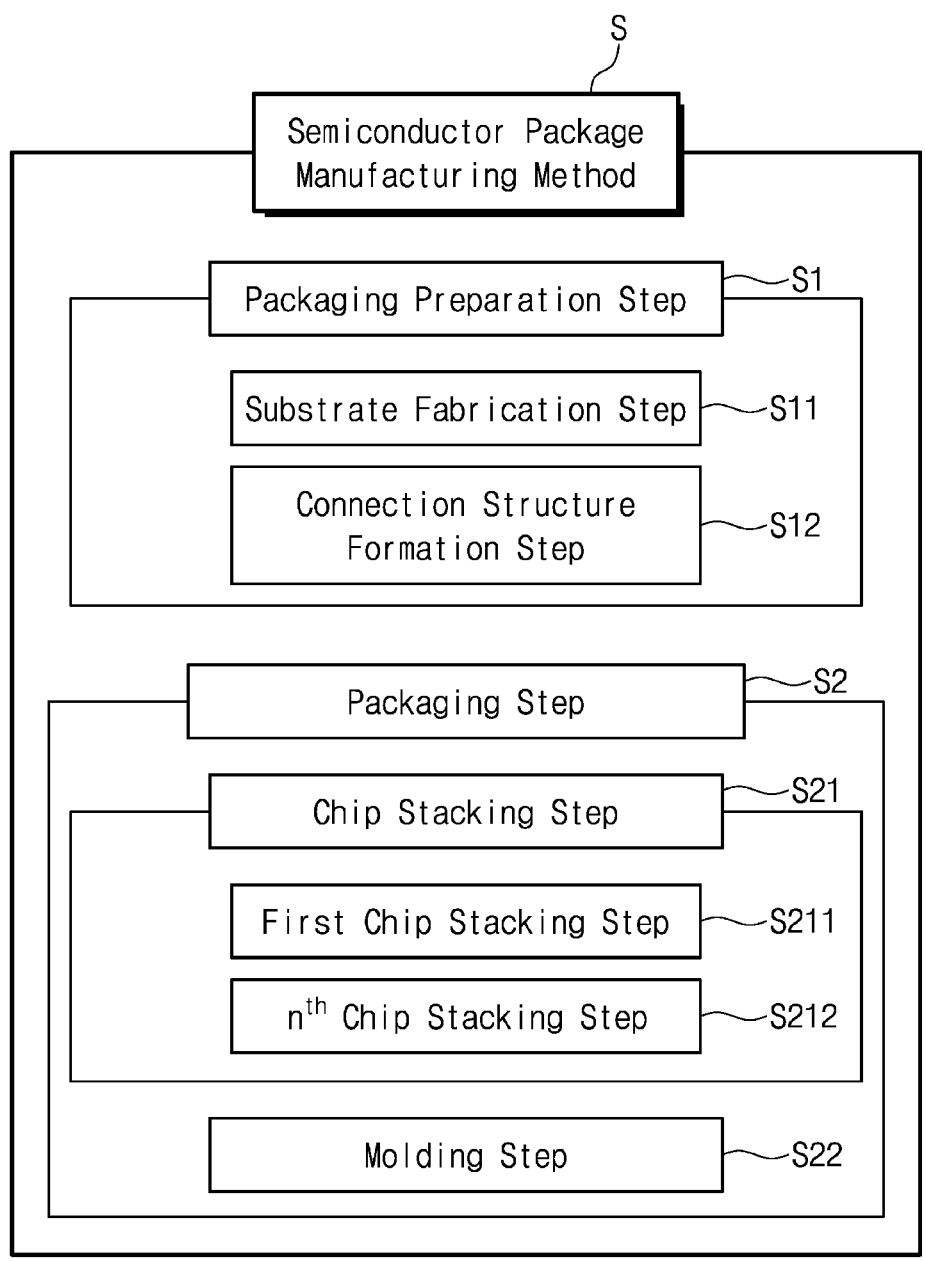
FIG. 2 illustrates a flow chart showing a method of manufacturing a semiconductor package according to some example embodiments of the present inventive concepts.

FIG. 2 illustrates a flow chart showing a method of manufacturing a semiconductor package according to some example embodiments of the present inventive concepts. FIGS. 3 to 11 illustrate cross-sectional views showing a method of manufacturing a semiconductor package, which method is based on the flow chart of FIG. 2.

Referring to FIG. 2, a semiconductor package manufacturing method S may include a packaging preparation step S1 and a packaging step S2. The packaging preparation step S1 may include a substrate fabrication step S11 and a connection structure formation step S12. The packaging step S2 may include a chip stacking step S21 and a molding step S22.

Figure 3:
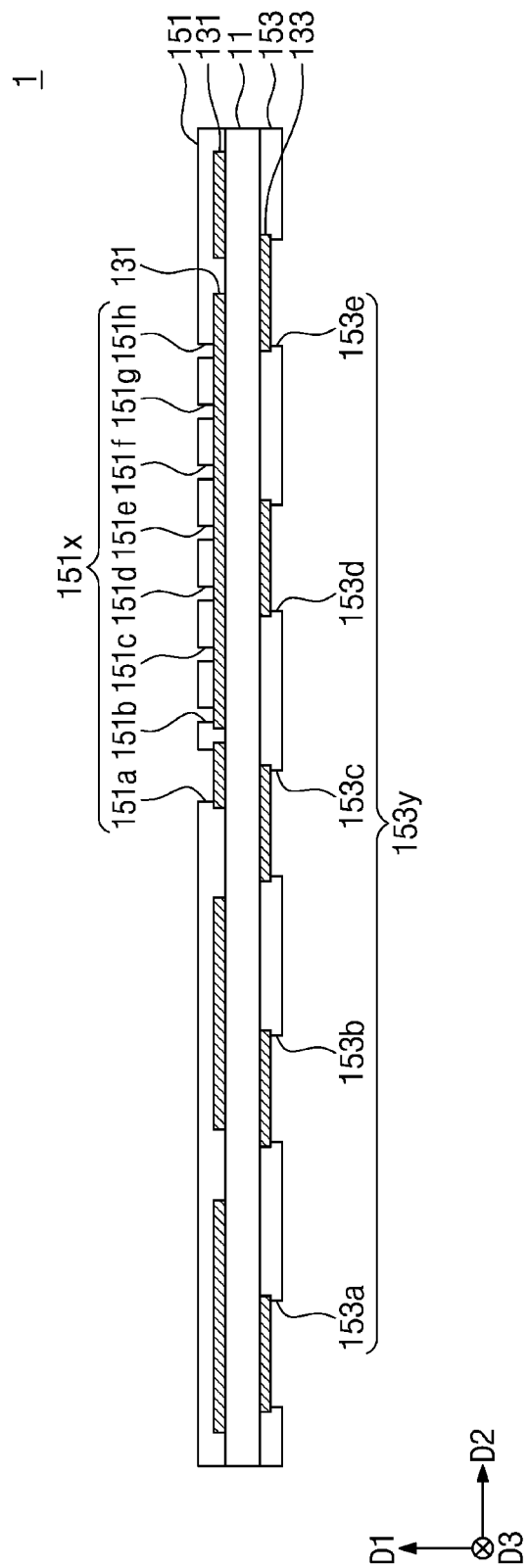
FIG. 3 illustrates a cross-sectional view showing a substrate according to some example embodiments of the present inventive concepts.

Referring to FIGS. 2 and 3, at the substrate fabrication step S11, a substrate 1 may be fabricated. The substrate 1 may include a middle dielectric layer 11, an upper conductive layer 131, a lower conductive layer 133, an upper dielectric layer 151, and a lower dielectric layer 153.

The middle dielectric layer 11 may be a main body of the substrate 1. The middle dielectric layer 11 may include a dielectric material. The middle dielectric layer 11 may be a core of the substrate 1. The middle dielectric layer 11 may include, for example, resin. Alternatively, the middle dielectric layer 11 may include a dielectric material different from the resin. The middle dielectric layer 11 may have, but is not limited to, a rectangular cross-section.

The upper conductive layer 131 may be provided on the middle dielectric layer 11. The upper conductive layer 131 may have various patterns. FIG. 3 shows a cross-sectional view where a plurality of the upper conductive layers 131 are all electrically disconnected from each other, but at least two of the upper conductive layers 131 may be electrically connected to each other in the third direction D3. The upper conductive layer 131 may include metal. For example, the upper conductive layer 131 may include copper.

The lower conductive layer 133 may be coupled below the middle dielectric layer 11. For example, the lower conductive layer 133 may be disposed below the middle dielectric layer 11. The lower conductive layer 133 may have various patterns. FIG. 3 shows a cross-section view where a plurality of the lower conductive layers 133 are all disconnected from each other, but certain ones of the lower conductive layers 133 may be connected to each other in the third direction D3. The lower conductive layer 133 may include a conductive material. For example, the lower conductive layer 133 may include copper.

The upper dielectric layer 151 may be provided on the upper conductive layer 131. The upper dielectric layer 151 may include a dielectric material. The upper dielectric layer 151 may protect the upper conductive layer 131 from the external environment. In certain embodiments, the upper dielectric layer 151 may include a solder resist (SR) or a photo solder resist (PSR). The present inventive concepts, however, are not limited thereto. The upper dielectric layer 151 may have upper holes 151x. The upper holes 151x may extend toward the upper conductive layer 131 from a top surface of the upper dielectric layer 151. The upper holes 151x may include a first upper hole 151a, a second upper hole 151b, a third upper hole 151c, a fourth upper hole 151d, a fifth upper hole 151e, a sixth upper hole 151f, a seventh upper hole 151g, and an eighth upper hole 151h. The number of the upper holes 151x need not be limited to eight, but may be less or greater than eight. The upper dielectric layer 151 may be formed by screen printing or roll coating.

The lower dielectric layer 153 may be provided below the lower conductive layer 133. The lower dielectric layer 153 may include a dielectric material. The lower dielectric layer 153 may protect the lower conductive layer 133 from the external environment. In certain embodiments, the lower dielectric layer 153 may include a solder resist (SR). For example, the lower dielectric layer 153 may include a photo solder resist (PSR). The present inventive concepts, however, are not limited thereto. The lower dielectric layer 153 may have lower holes 153y. The lower holes 153y may extend toward the lower conductive layer 133 from a bottom surface of the lower dielectric layer 153. The lower holes 153y may include a first lower hole 153a, a second lower hole 153b, a third lower hole 153c, a fourth lower hole 153d, and a fifth lower hole 153e. The number of the lower holes 153y need not be limited to five, but may be less or greater than five. The lower dielectric layer 153 may be formed by screen printing or roll coating.

The substrate fabrication step S11 may be performed at a different location from where the packaging step S2 is performed. Alternatively, the substrate fabrication step S11 and the packaging step S2 may be performed at the same location.

Figure 4:
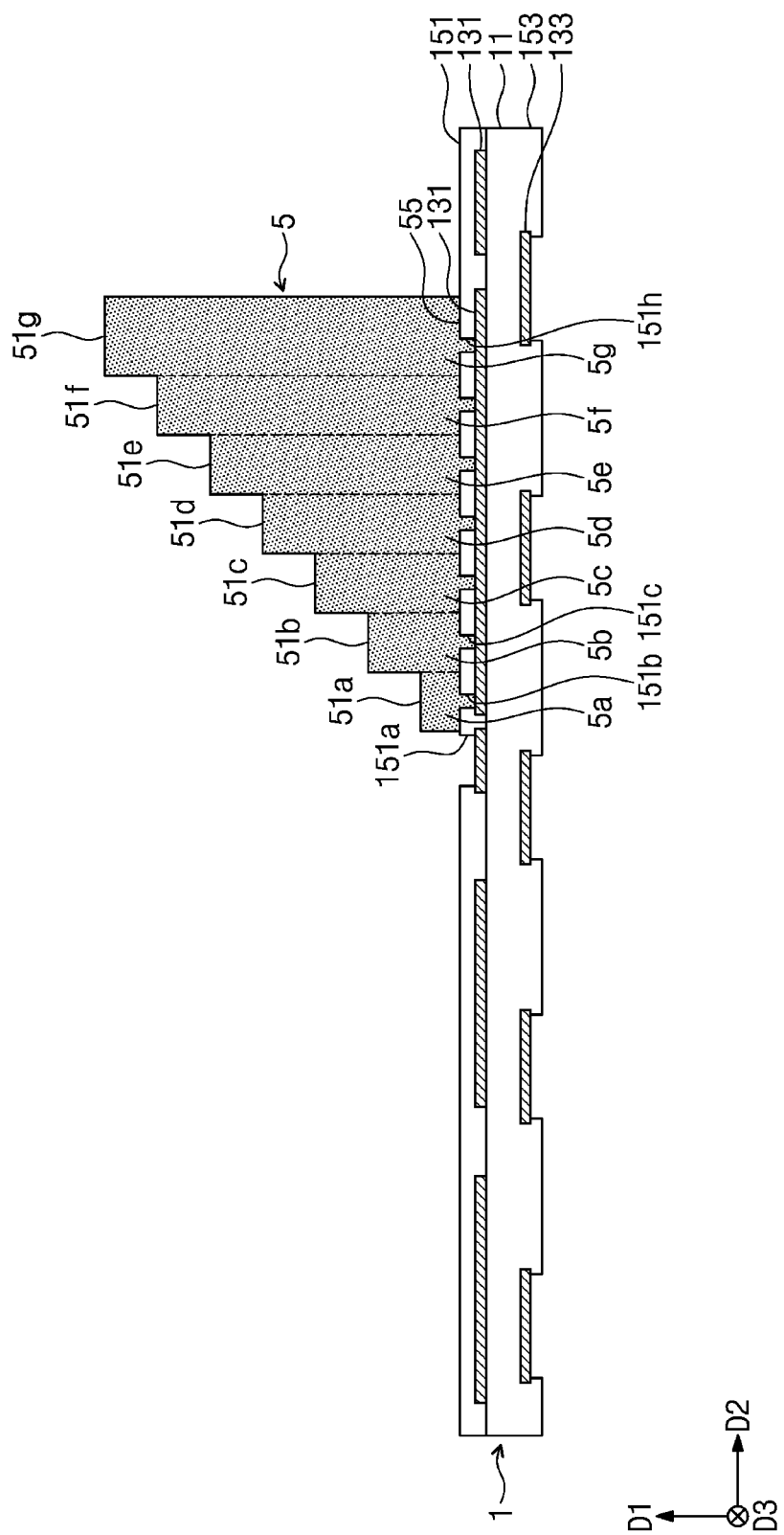
FIG. 4 illustrates a cross-sectional view showing an example in which a substrate and a connection structure are assembled to each other according to some example embodiments of the present inventive concepts.

Referring to FIGS. 2 and 4, the connection structure formation step S12 may include forming a connection structure 5 on the substrate 1. The connection structure 5 may include a dielectric material. For example, the connection structure 5 may include a solder resist (SR) or a photo solder resist (PSR). The present inventive concepts, however, are not limited thereto. The connection structure 5 may be stacked on the upper dielectric layer 151.

The connection structure 5 may extend to a certain height in the first direction D1 from the top surface of the upper dielectric layer 151. The connection structure 5 may include one or more structures. For example, the connection structure 5 may include a first structure 5a, a second structure 5b, a third structure 5c, a fourth structure 5d, a fifth structure 5e, a sixth structure 5f, and a seventh structure 5g. The first to seventh structures 5a to 5g may have different lengths from each other. Alternatively, the connection structure 5 may include only one structure when only two semiconductor chips are stacked.

Each of the first to seventh structures 5a to 5g may be formed integrally with the upper dielectric layer 151. For example, the upper dielectric layer 151 and each of the first to seventh structures 5a to 5g may be formed of the same material without a boundary therebetween (e.g., in a single process). The first to seventh structures 5a to 5g may be formed by repeatedly performing stacking and etching processes in which a mask or the like is used. Alternatively, the first to seventh structures 5a to 5g may be formed by an injection molding process. Any other processes may be employed to form the first to seventh structures 5a to 5g.

The first structure 5a may upwardly extend to a certain height from the upper dielectric layer 151. The first structure 5a may be disposed on the second upper hole 151b. The first structure 5a may have a first top surface 51a. The first top surface 51a may be substantially parallel to the substrate 1. The present inventive concepts, however, are not limited to that discussed above.

The second structure 5b may be disposed on the right side of the first structure 5a. Alternatively, the second structure 5b may be directed in the third direction D3 from the first structure 5a. The second structure 5b may be directly connected to the first structure 5a. Alternatively, the second structure 5b may be spaced apart from the first structure 5a.

The second structure 5b may extend to a certain height in the first direction D1 from the upper dielectric layer 151. The second structure 5b may be disposed on the third upper hole 151c. The second structure 5b may have a second top surface 51b. The second top surface 51b may be substantially parallel to the top surface of the upper dielectric layer 151. The present inventive concepts, however, are not limited thereto. The second top surface 51b may be higher than the first top surface 51a. In this configuration, a distance between the second top surface 51b and the upper dielectric layer 151 may be greater than a distance between the first top surface 51a and the upper dielectric layer 151. The second structure 5b may be longer than the first structure 5a.

The third to seventh structures 5c to 5g may be configured the same as that discussed above. For example, the third to seventh structures 5c to 5g may be respectively disposed on the fourth to eighth upper holes 151d to 151h, and may respectively have third to seventh top surfaces 51c to 51g substantially parallel to the top surface of the upper dielectric layer 151. The first to seventh structures 5a to 5g may have their heights that increase in a direction from the first structure 5a toward the seventh structure 5g. The first to seventh structures 5a to 5g may all be arranged on the right sides of neighboring ones. Alternatively, one or more of the first to seventh structures 5a to 5g may be arranged on the right sides of neighboring ones, and other one or more of the first to seventh structures 5a to 5g may be arranged in the third direction D3.

The first to seventh structures 5a to 5g may have their bottom surfaces at the same level, which may result in the formation of a single plane 55. Alternatively, the first to seventh structures 5a to 5g may have their bottom surfaces at different levels from each other.

Figure 5:
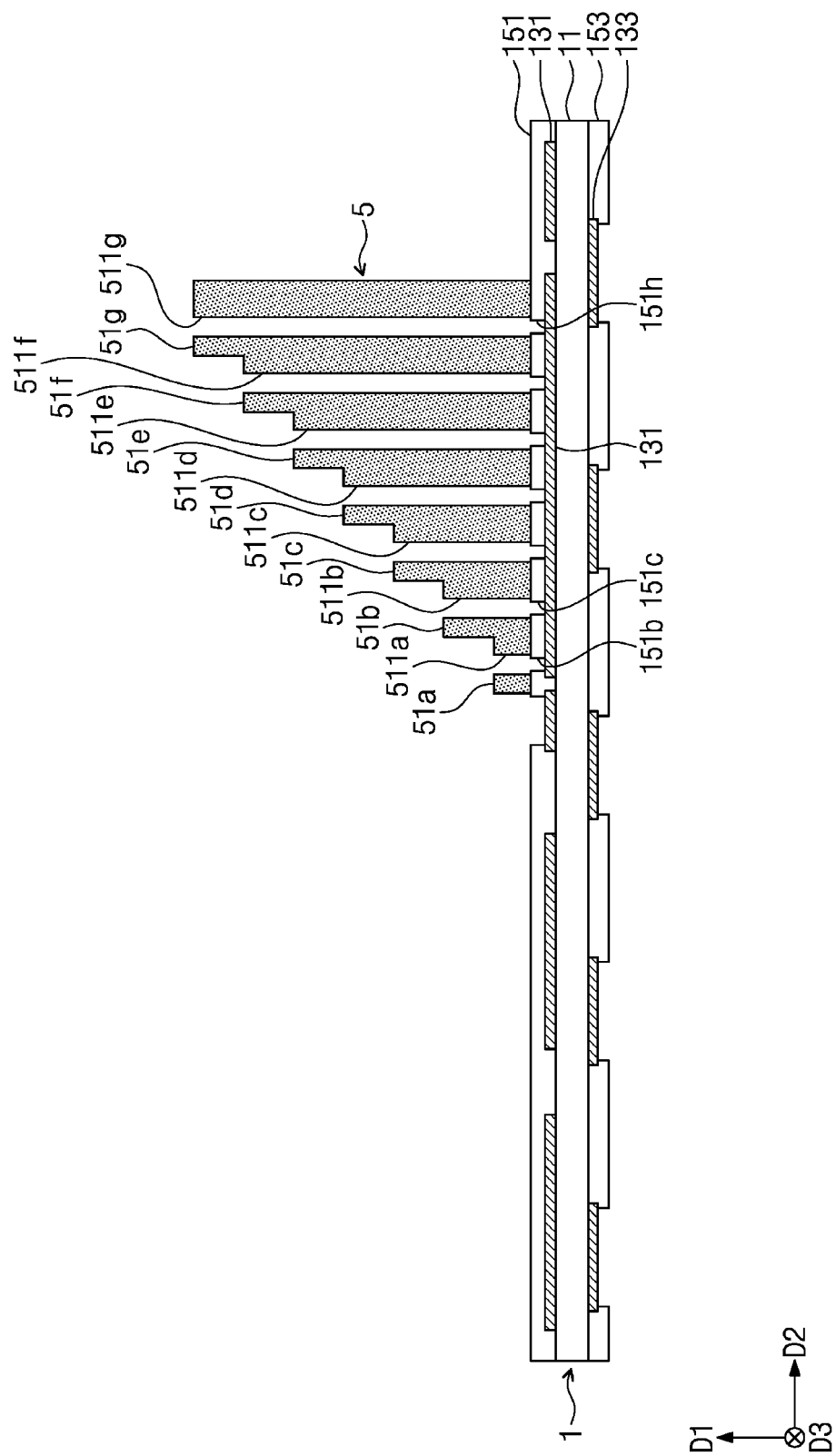
FIG. 5 illustrates a cross-sectional view showing an example in which holes are formed in a connection structure according to some example embodiments of the present inventive concepts.

Referring to FIG. 5, one or more holes may be formed in the connection structure 5. A first hole 511a may be formed to extend from the first top surface 51a to the upper dielectric layer 151. A second hole 511b may be formed to extend from the second top surface 51b to the upper dielectric layer 151. Likewise, each of third to seventh holes 511c to 511g may be formed to extend from a corresponding one of the third to seventh top surfaces 51c to 51g to the upper dielectric layer 151. For example, each of the first to seventh holes 511a to 511g may be formed by laser drilling or mechanical drilling. For another example, when the connection structure 5 is stacked, a mask or the like may be used to form the first to seventh holes 511a to 511g at the same time.

The first to seventh holes 511a to 511g may be spatially connected to the second to eighth upper holes 151b to 151h, respectively. The upper conductive layer 131 may be exposed through the second to eighth upper holes 151b to 151h to the first to seventh holes 511a to 511g.

Figure 6:
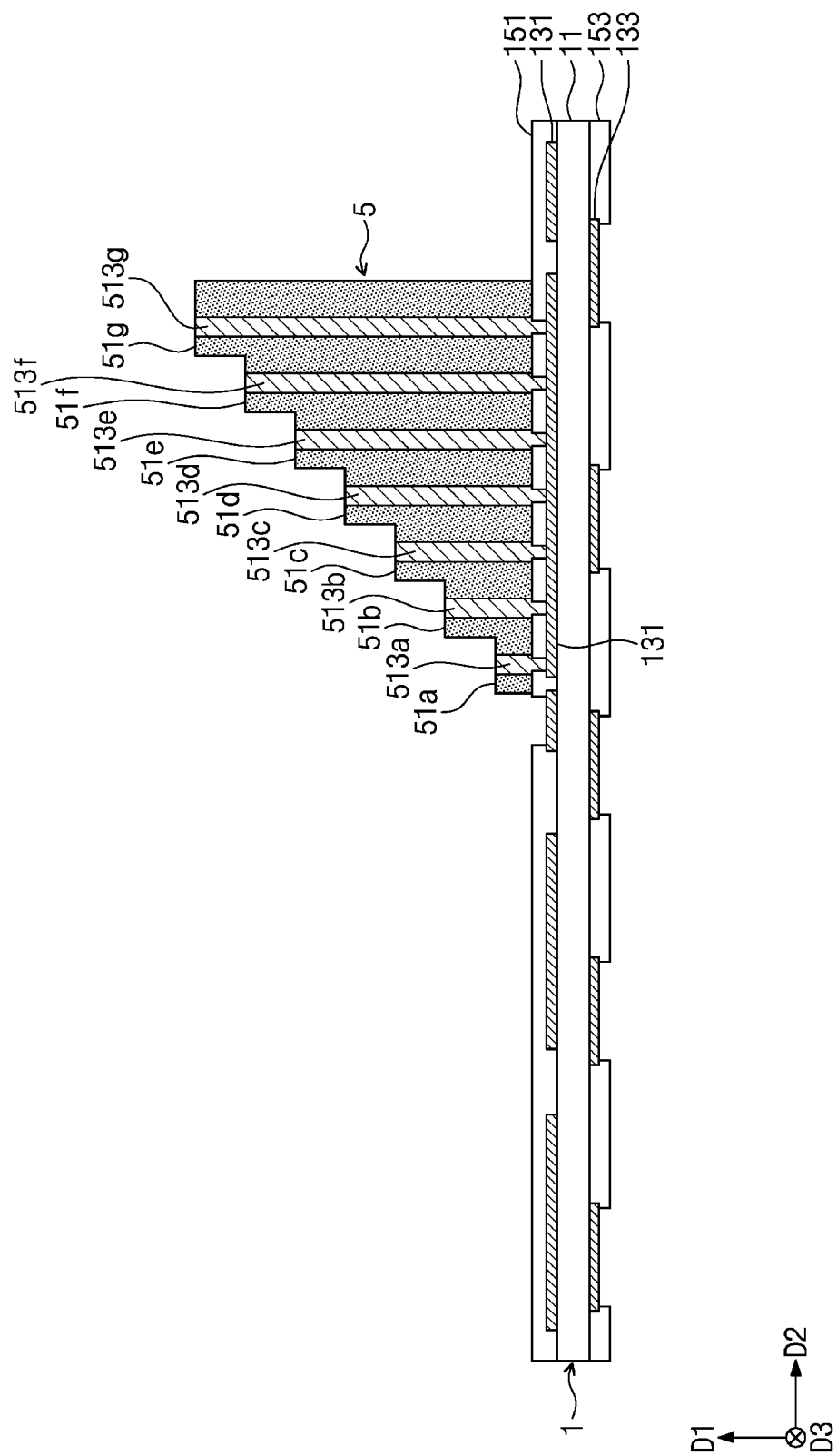
FIG. 6 illustrates a cross-sectional view showing an example in which a conductive material fills holes of a connection structure according to some example embodiments of the present inventive concepts.

Referring to FIG. 6, a columnar conductor may be formed in each of the first to seventh holes 511a to 511g. In an exemplary embodiment, the columnar conductor may a height greater than a width. In an exemplary embodiment, the columnar conductor may have a height equal to or greater than one semiconductor chip to be stacked. A first columnar conductor 513a may be formed in the first hole 511a. A second columnar conductor 513b may be formed in the second hole 511b. Likewise, third to seventh columnar conductors 513c to 513g may be respectively formed in the third to seventh holes 511c to 511g. FIG. 6 shows an example in which the first to seventh columnar conductors 513a to 513g are positioned in the first to seventh holes 511a to 511g formed in the first to seventh structures 5a to 5g, but the present inventive concepts are not limited thereto. The first to seventh columnar conductors 513a to 513g may extend along the first to seventh structures 5a to 5g, respectively. For example, the first to seventh columnar conductors 513a to 513g may be attached to sidewalls of the first to seventh structures 5a to 5g, respectively. The first to seventh columnar conductors 513a to 513g may be variously disposed to be supported by the first to seventh structures 5a to 5g, respectively.

The substrate 1 and the connection structure 5 assembled on a top surface of the substrate 1 may constitute a substrate assembly. The connection structure 5 may include the structures 5a to 5g that extends upwardly from the substrate 1 and the columnar conductors 513a to 513g penetrating the structures 5a to 5g to be in contact with the substrate 1, respectively.

The first columnar conductor 513a may have a top surface at the same level as that of the first top surface 51a. Alternatively, the first columnar conductor 513a may have a top surface at a level higher or lower than that of the first top surface 51a. The description above may also be identically or similarly applicable to the second to seventh columnar conductors 513b to 513g.

The connection structure formation step S12 may be performed at a different location from where the packaging step S2 is performed. Alternatively, the connection structure formation step S12 and the packaging step S2 may be performed at the same location.

Figure 7:
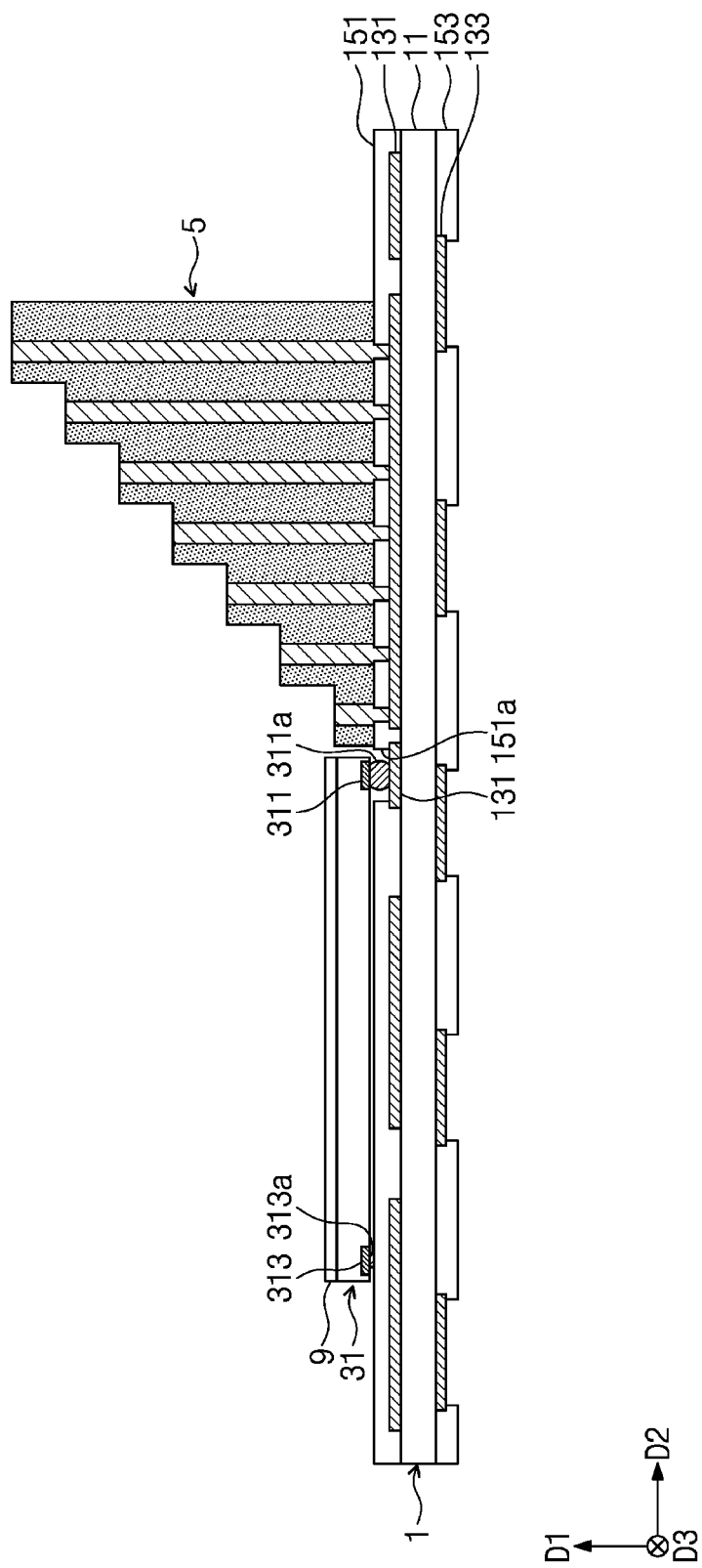
FIG. 7 illustrates a cross-sectional view showing a step of stacking a first semiconductor chip according to some example embodiments of the present inventive concepts.

Referring to FIGS. 2 and 7, the substrate 1 may be prepared on which the connection structure 5 is provided. The chip stacking step S21 may include a first chip stacking step S211. At the first chip stacking step S211, a first semiconductor chip 31 may be stacked on the substrate 1. For example, a non-illustrated connection structure or any other component may be used to stack the first semiconductor chip 31 onto the substrate 1. For another example, the first semiconductor chip 31 may be directly stacked on the substrate 1. The first semiconductor chip 31 may include a first connection pad 311, a first connection terminal 311a, a first ordinary pad 313, and a first ordinary terminal 313a.

The first connection pad 311 may be provided on a bottom surface at one side of the first semiconductor chip 31. The first connection pad 311 may include a conductive material. The first connection pad 311 may have, but not limited to, a rectangular cross-section. The first connection terminal 311a may be placed below the first connection pad 311. The first connection terminal 311a may include a conductive material. For example, the first connection terminal 311a may include solder. The first connection terminal 311a may be positioned on the upper conductive layer 131 exposed to the first upper hole 151a. The first connection pad 311 may be connected through the first connection terminal 311a to the upper conductive layer 131. The first semiconductor chip 31 may be electrically connected to the substrate 1 through the first connection pad 311 and the first connection terminal 311a.

The first ordinary pad 313 may be positioned on a bottom surface at another side of the first semiconductor chip 31. The first ordinary pad 313 may include a conductive material. Alternatively, the first ordinary pad 313 may include no conductive material. The first ordinary terminal 313a may be placed below the first ordinary pad 313. The first ordinary terminal 313a may include a conductive material. Alternatively, the first ordinary terminal 313a may include no conductive material. The first ordinary terminal 313a may be placed on the upper dielectric layer 151. The first ordinary pad 313 and the first ordinary terminal 313a need not serve to electrically connect the first semiconductor chip 31 to the substrate 1. The first ordinary pad 313 and the first ordinary terminal 313a may mechanically support the first semiconductor chip 31.

An adhesive layer 9 may be coated on the first semiconductor chip 31. The adhesive layer 9 may attach the first semiconductor chip 31 to other component. Alternatively, the adhesive layer 9 may be absent.

Figure 8:
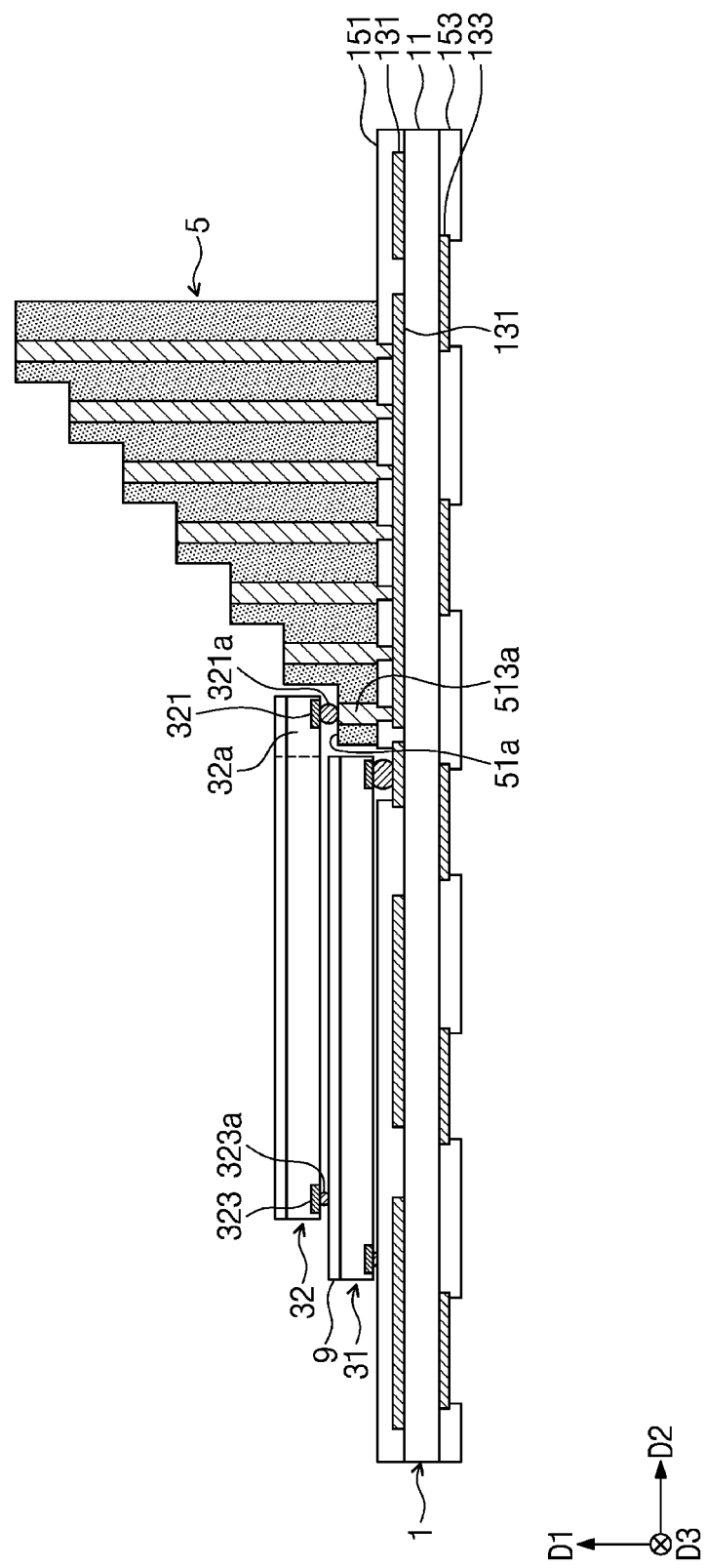
FIG. 8 illustrates a cross-sectional view showing a step of stacking a second semiconductor chip according to some example embodiments of the present inventive concepts.
Figure 9:
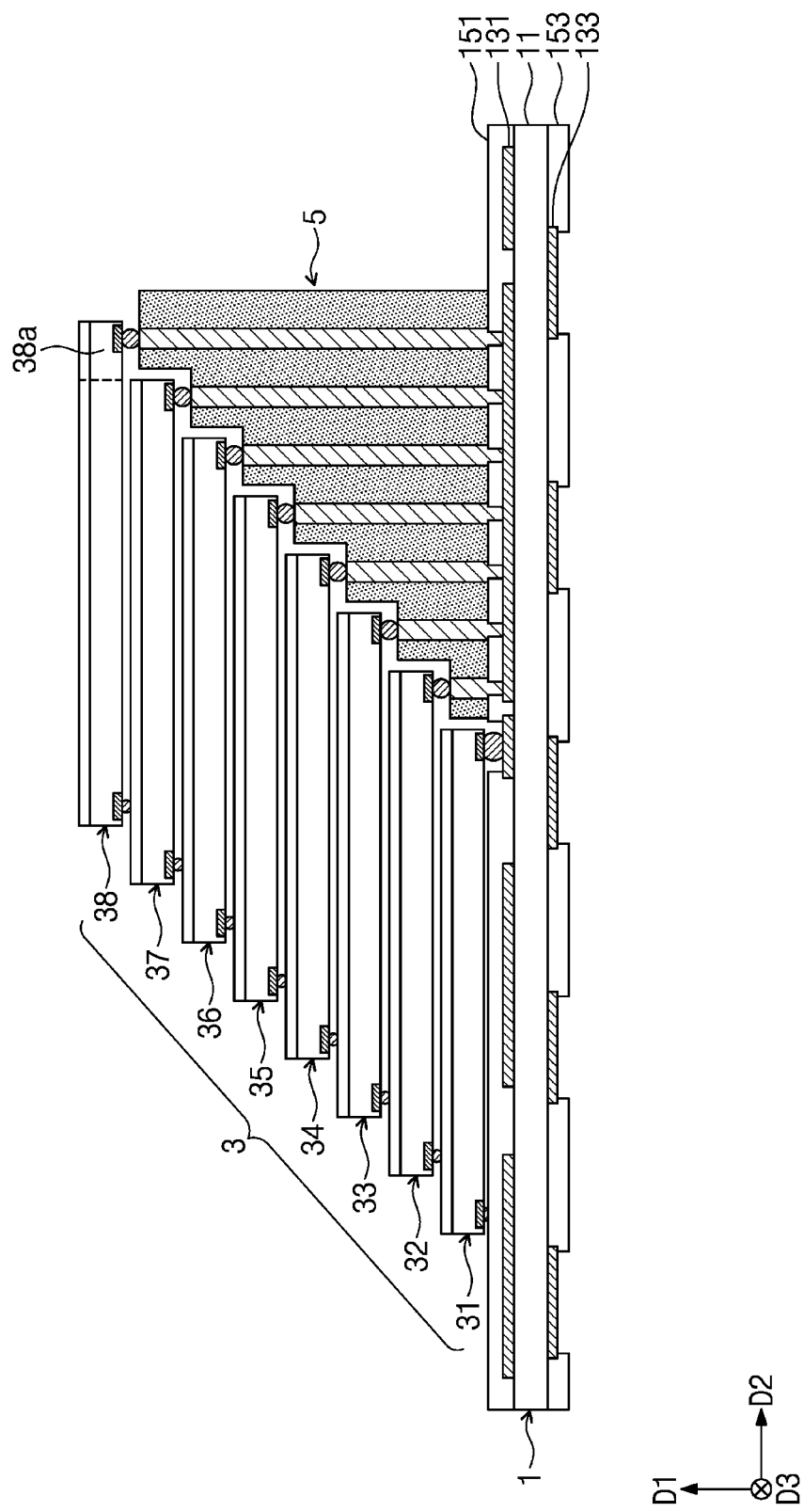
FIG. 9 illustrates a cross-sectional view showing an example in which stacking of semiconductor chips is completed according to some example embodiments of the present inventive concepts.

Referring to FIGS. 2, 8, and 9, the chip stacking step S21 may include an $n^{th}$ stacking step S212. In certain embodiments, n may be a natural number equal to or greater than 2.

Referring to FIG. 8, the $n^{th}$ chip stacking step S212 may include stacking a second semiconductor chip 32 on the first semiconductor chip 31. When the second semiconductor chip 32 is stacked on the first semiconductor chip 31, a portion of the second semiconductor chip 32 may overlap the first semiconductor chip 31, and another portion of the second semiconductor chip 32 may protrude outwardly beyond one side of the first semiconductor chip 31. The second semiconductor chip 32 may be positioned outside the connection structure 5 with the first columnar conductor 513a. The other portion protruding outwardly from the first semiconductor chip 31 may be called a first segment 32a of the second semiconductor chip 32. For example, the first segment 32a may protrude outwardly beyond one side of the first semiconductor chip 31 in the second direction D2 or in the third direction D3. The present inventive concepts are not limited thereto. For example, the first segment 32a may protrude outwardly beyond two sides of the first semiconductor chip 31 in both the second direction D2 and the third direction D3.

The first segment 32a of the second semiconductor chip 32 may be disposed on the first structure 5a. The first segment 32a of the second semiconductor chip 32 may include a second connection pad 321 and a second connection terminal 321a. The second connection pad 321 may include a conductive material. The second connection pad 321 may be positioned on a bottom surface at one side of the second semiconductor chip 32, or on a bottom surface of the first segment 32a. The second connection terminal 321a may be placed below the second connection pad 321. The second connection terminal 321a may include a conductive material. For example, the second connection terminal 321a may include solder. The second connection terminal 321a may be placed on the first columnar conductor 513a. The second connection terminal 321a may connect the second connection pad 321 to the first columnar conductor 513a. The second semiconductor chip 32 may be electrically connected to the substrate 1 through the second connection terminal 321a and the first columnar conductor 513a.

The second semiconductor chip 32 may further include a second ordinary pad 323 and a second ordinary terminal 323a. The second ordinary pad 323 may be positioned on a bottom surface at another side of the second semiconductor chip 32. The second ordinary pad 323 may include a conductive material. Alternatively, the second ordinary pad 323 may include no conductive material. The second ordinary terminal 323a may be placed below the second ordinary pad 323. The second ordinary terminal 323a may include a conductive material. Alternatively, the second ordinary terminal 323a may include no conductive material. The second ordinary terminal 323a may be positioned on the adhesive layer 9 of the first semiconductor chip 31. Alternatively, the second ordinary terminal 323a may be in contact with a top surface of the first semiconductor chip 31. The second ordinary pad 323 and the second ordinary terminal 323a need not serve to electrically connect the second semiconductor chip 32 to the substrate 1. The second ordinary pad 323 and the second ordinary terminal 323a may mechanically support the second semiconductor chip 32. The term "contact" or "in contact with" as used herein refers to a direct connection (e.g., touching).

The second semiconductor chip 32 may be substantially parallel to the first semiconductor chip 31. The present inventive concepts, however, are not limited thereto. As shown in FIG. 8, the second semiconductor chip 32 may have the same size as that of the first semiconductor chip 31. Alternatively, the second semiconductor chip 32 may have a different size from that of the first semiconductor chip 31. The second semiconductor chip 32 may have a greater area than that of the first semiconductor chip 31. The first and second semiconductor chips 31 and 32 may be identical or non-identical chips.

An adhesive layer 9 may be coated on the second semiconductor chip 32. The adhesive layer 9 may attach the second semiconductor chip 32 to other components. Alternatively, the adhesive layer 9 may be absent.

Although the second semiconductor chip 32 includes the first segment 32a that overhangs one side of the first semiconductor chip 31, the second semiconductor chip 32 may be rigidly supported by the first columnar conductor 513a. For example, the first columnar conductor 513a may structurally support the first segment 32a of the second semiconductor chip 32. In this manner, although the second semiconductor chip 32 includes the first segment 32a, the second semiconductor chip 32 may be rigidly supported because the first structure 5a supports the first segment 32a of the second semiconductor chip 32.

Referring to FIG. 9, third to eighth semiconductor chips 33 to 38 may be stacked in the same manner used for stacking the second semiconductor chip 32. The third to eighth semiconductor chips 33 to 38 may be respectively supported by the second to seventh columnar conductors 513b to 513g. The third to eighth semiconductor chips 33 to 38 may be electrically connected to the substrate 1 through the second to seventh columnar conductors 513b to 513g, respectively.

FIG. 9 shows that when the second to eighth semiconductor chips 32 to 38 are stacked, a first segment of an $n^{th}$ semiconductor chip may protrude in a rightward direction beyond one side of a first segment of an $(n-1)^{th}$ semiconductor chip. The present inventive concepts, however, are not limited to that discussed above. For example, the first segment of the $n^{th}$ semiconductor chip may protrude in the third direction D3 beyond one side of the $(n-1)^{th}$ semiconductor chip. For another example, a first portion of the $n^{th}$ semiconductor chip may protrude in the rightward direction beyond one side of the first segment of the $(n-1)^{th}$ semiconductor chip, and a second portion of the $n^{th}$ semiconductor chip may protrude in the third direction D3 beyond another side of the $(n-1)^{th}$ semiconductor chip different from the side of the first segment of the $(n-1)^{th}$ semiconductor chip. In other words, the $n^{th}$ semiconductor chip may protrude beyond two sides of the $(n-1)^{th}$ semiconductor chip adjacent to each other in both the second direction D2 and the third direction D3.

After the semiconductor chips 3 are stacked, a bonding step may be performed to couple balls of the semiconductor chips to the columnar conductors 513a to 513g. A reflow process or a thermocompression process may be employed to perform the bonding step. At the bonding step, heat and/or pressure may be applied such that the balls and the columnar conductors are wholly or partially melted and coupled.

The bonding step may be carried out after the chip stacking step S21 is completed. The balls may all be coupled to the columnar conductors at the same time. Alternatively, the bonding step may be carried out after each one of the first to eighth semiconductor chip 31 to 38 is stacked. The balls may be coupled to the columnar conductors at each bonding step.

Figure 10:
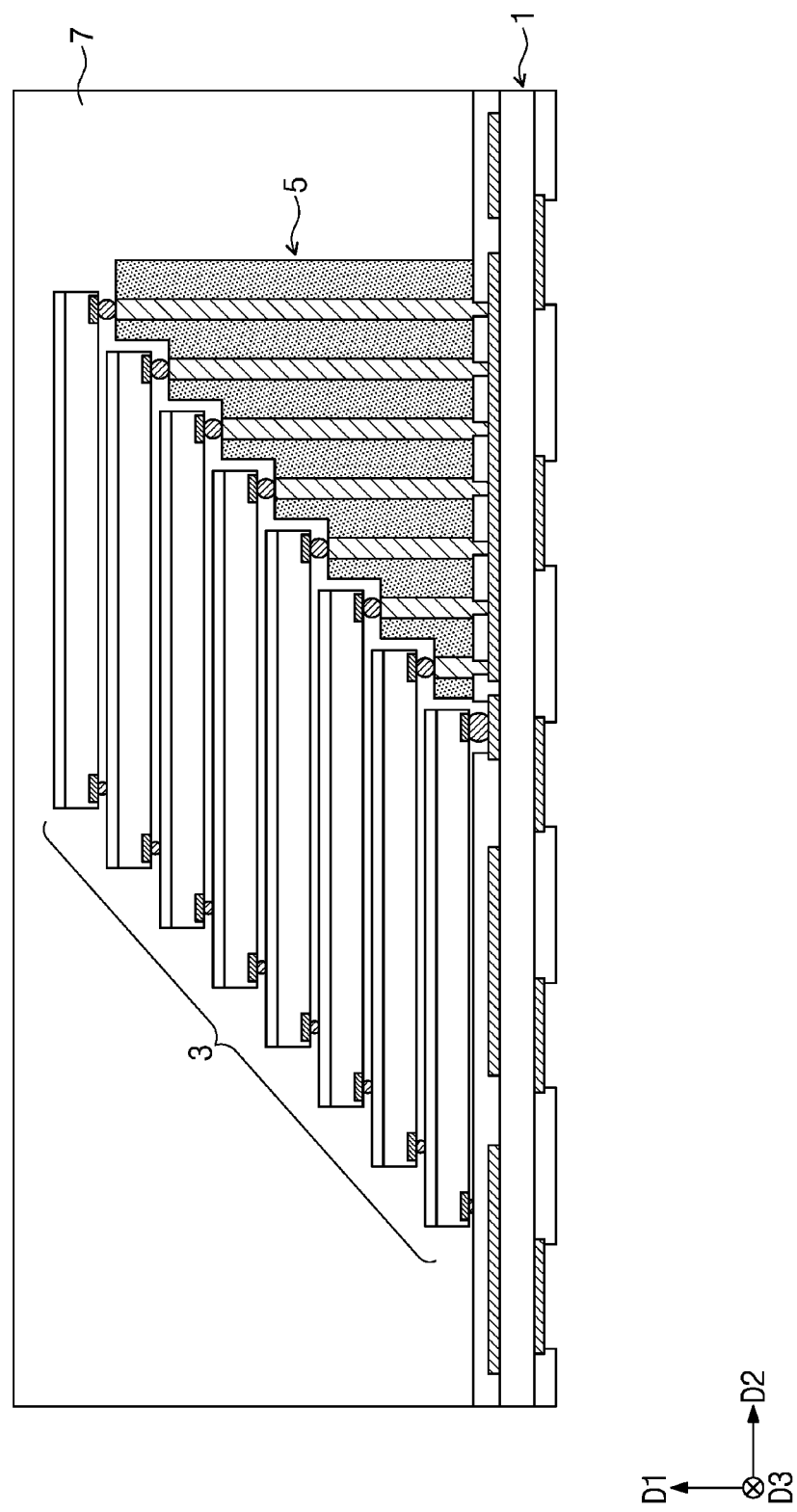
FIG. 10 illustrates a cross-sectional view showing a molding step according to some example embodiments of the present inventive concepts.

Referring to FIGS. 2 and 10, the molding step S22 may be performed after the chip stacking step S21 is completed. At the molding step S22, the semiconductor chips 3 may be encapsulated by a molding layer 7. For example, a mold may receive the substrate 1 on which the semiconductor chips 3 are stacked and also receive a molding material to form the molding layer 7. The molding layer 7 may protect the semiconductor chips 3 from external heat, impact, or moisture, for example. The molding layer 7 may outwardly discharge heat generated from the semiconductor chips 3.

Figure 11:
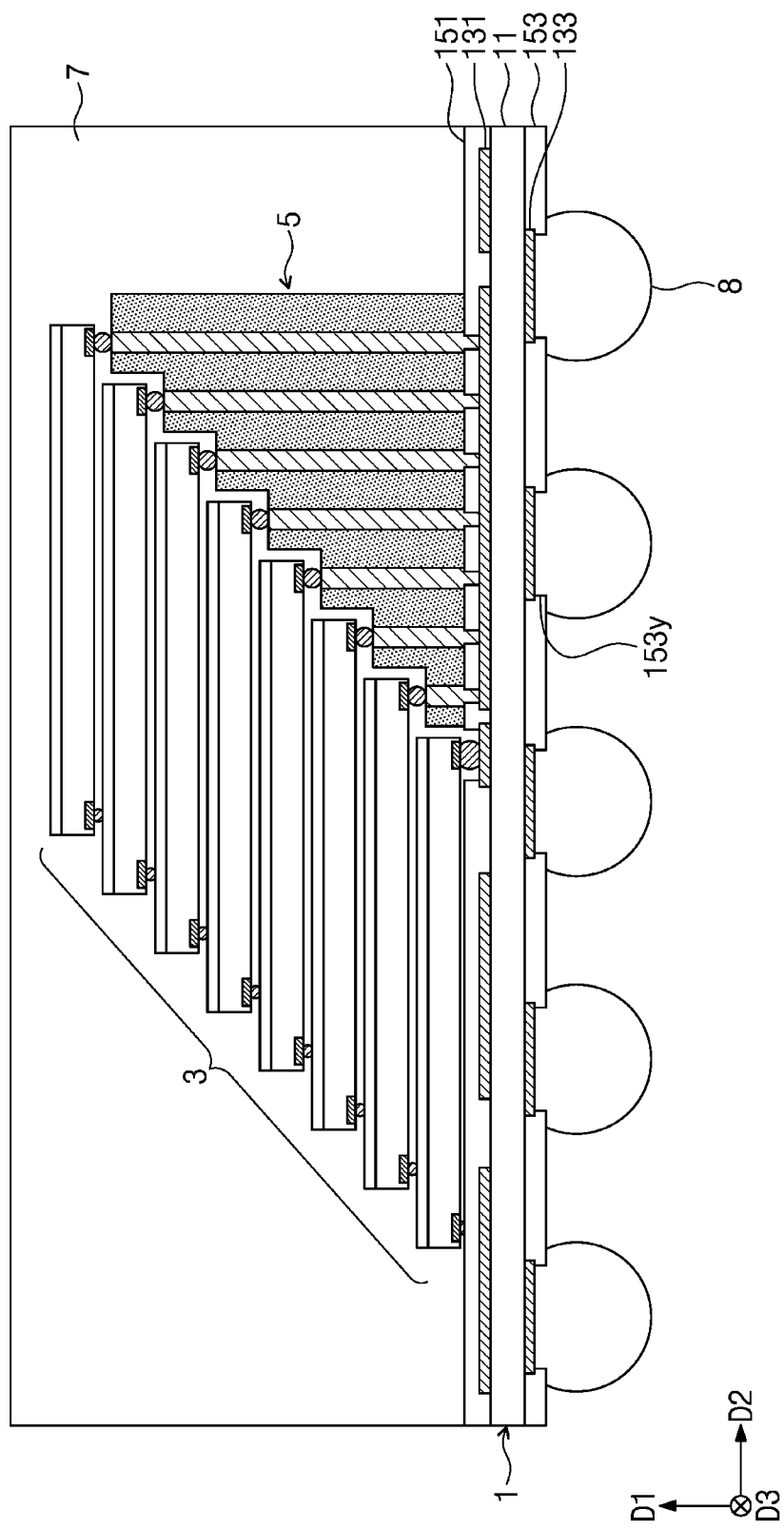
FIG. 11 illustrates a cross-sectional view showing an example in which external balls are attached to a semiconductor package according to some example embodiments of the present inventive concepts.

Referring to FIG. 11, after the molding step S22 is completed, external connection terminals 8 may be formed. For example, the external connection terminals 8 may include external balls. The external connection terminals 8 may be coupled through lower holes 153y to the lower conductive layer 133 exposed at the bottom surface of the substrate 1. The external connection terminals 8 may include a conductive material. The external connection terminals 8 may include solder. A reflow process may be performed to couple the external connection terminals 8 to the lower conductive layer 133. A semiconductor package may be electrically connected through the external connection terminals 8 to other package or board.

In accordance with a method of manufacturing a semiconductor package according to some example embodiments of the present inventive concepts, stacked chips may be directly connected to a substrate. There may be no need to form bonding wires or to perform additional processes required for wire bonding. The semiconductor package manufacturing method may become simplified, and manufacturing cost may be reduced. It may be possible to omit the formation of bonding fingers required for wire bonding. A semiconductor package may decrease in size. The method may also manufacture a semiconductor package at lower cost than that of other methods based on a through-silicon-via (TSV) scheme.

In accordance with a method of manufacturing a semiconductor package according to some example embodiments of the present inventive concepts, stacked chips may include columnar conductors that are directly connected to a substrate, and as a result, signal paths may be reduced. For example, the stacked chips may include columnar conductors that are in contact with a substrate for reduced signal paths. Therefore, the method may manufacture a semiconductor package having low power consumption, high signal transferring speed, and low noise. Further, less heat may be generated from the semiconductor package.

In accordance with a method of manufacturing a semiconductor package according to some example embodiments of the present inventive concepts, although an overlying semiconductor chip includes a first segment (or an overhang structure) that protrudes outwardly from an underlying semiconductor chip, the overlying semiconductor chip may be supported by a connection structure to stably stack the semiconductor chips. Even when the overlying semiconductor chip is bigger than the underlying semiconductor chip, or even though the first segment is present, stress concentration on one side of the overlying or underlying semiconductor chip that could be caused by the overhang structure may be prevented. More particularly, stress concentration on the first segment of the overlying semiconductor chip that could be caused by the overhang structure may be prevented. Even though heat is applied at a bonding step or a molding step, concentration of stress may be avoided because the first segment is supported by the connection structure. A semiconductor package may be free of defects such as warpage or crack. As a result, it may be possible to increase fabrication yield of semiconductor packaging processes and to reduce manufacturing cost of semiconductor packages.

Figure 12:
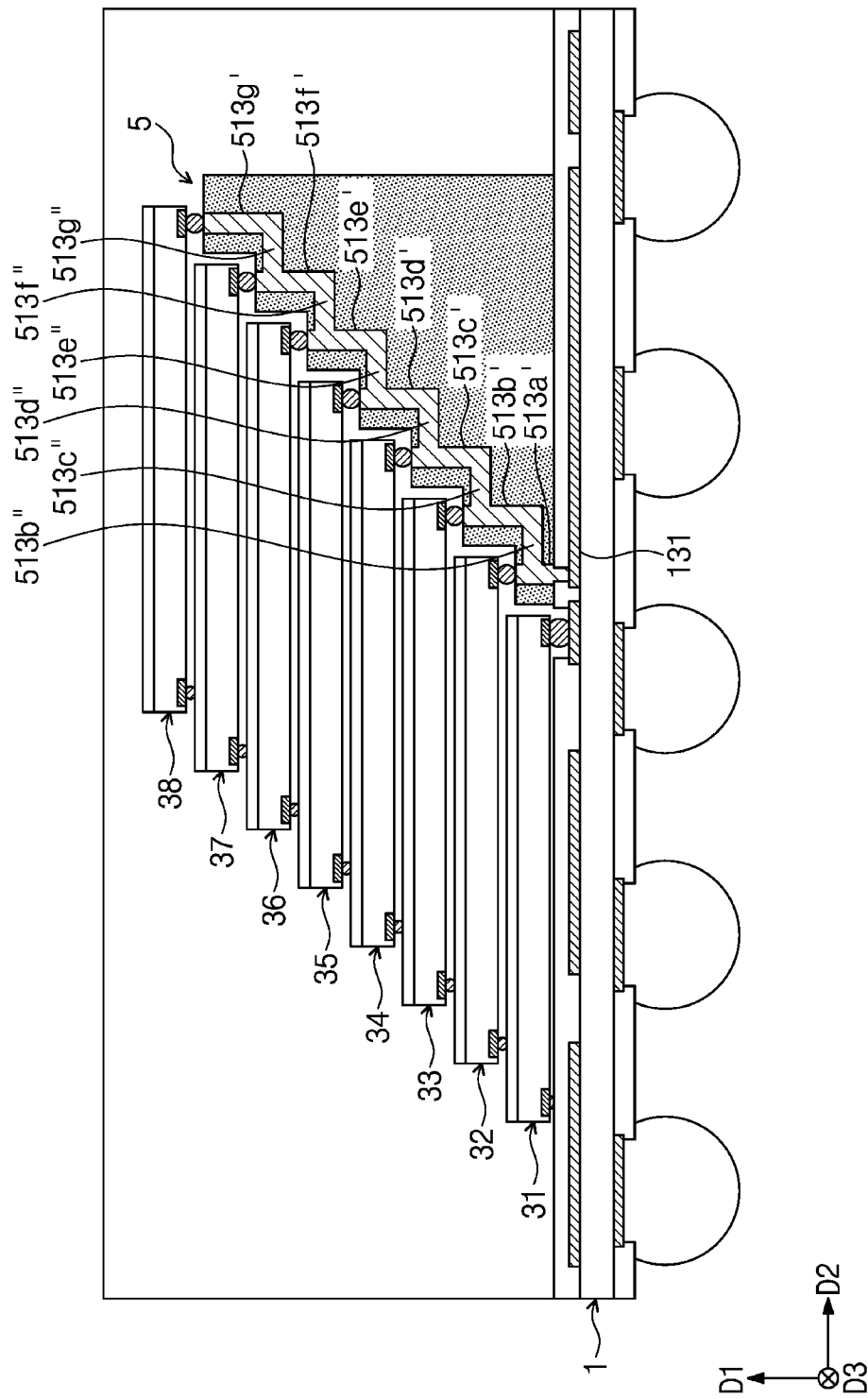
FIG. 12 illustrates a cross-sectional view showing a semiconductor package according to some example embodiments of the present inventive concepts.

FIG. 12 illustrates a cross-sectional view showing a semiconductor package according to some example embodiments of the present inventive concepts.

In the embodiment that follows, components and/or processes substantially identical or similar to those discussed above with reference to FIGS. 1 to 11 will be omitted for convenience of description.

Referring to FIG. 12, the connection structure 5 may include first to seventh columnar conductors 513a' to 513g' connected to each other. For example, the seventh columnar conductor 513g' may be connected to the sixth columnar conductor 513f. The connection structure 5 may further include a seventh connector 513g". The seventh connector 513g" may connect the seventh columnar conductor 513g' to the sixth columnar conductor 513f. The seventh connector 513g" may include a conductive material. The seventh connector 513g" may extend in a direction perpendicular to an extending direction of the seventh columnar conductor 513g'. Alternatively, the seventh connector 513g" may be connected obliquely to the seventh columnar conductor 513g'. Similarly, an n$^{th}$ connector may further be provided to connect an n$^{th}$ columnar conductor to an (n-1)$^{th}$ columnar conductor. The n$^{th}$ connector may be one of second to sixth connectors 513b" to 513f".

Each of the second to seventh columnar conductors 513b' to 513g' may not be directly connected to the upper conductive layer 131 of the substrate 1. For example, each of the second to seventh columnar conductors 513b' to 513g' may not be in contact with the upper conductive layer 131 of the substrate 1. Each of the second to seventh columnar conductors 513b' to 513g' may be connected through the first columnar conductor 513a' to the upper conductive layer 131 of the substrate 1.

In certain embodiments, the connection structure 5 may be formed prior to the molding step, and thus inner holes and the first to seventh columnar conductors 513a' to 513g' positioned in the inner holes may have no limitation in shape. If necessary, each of the first to seventh columnar conductors 513a' to 513g' may be variously branched to be connected to a columnar conductor adjacent thereto.

Figure 13:
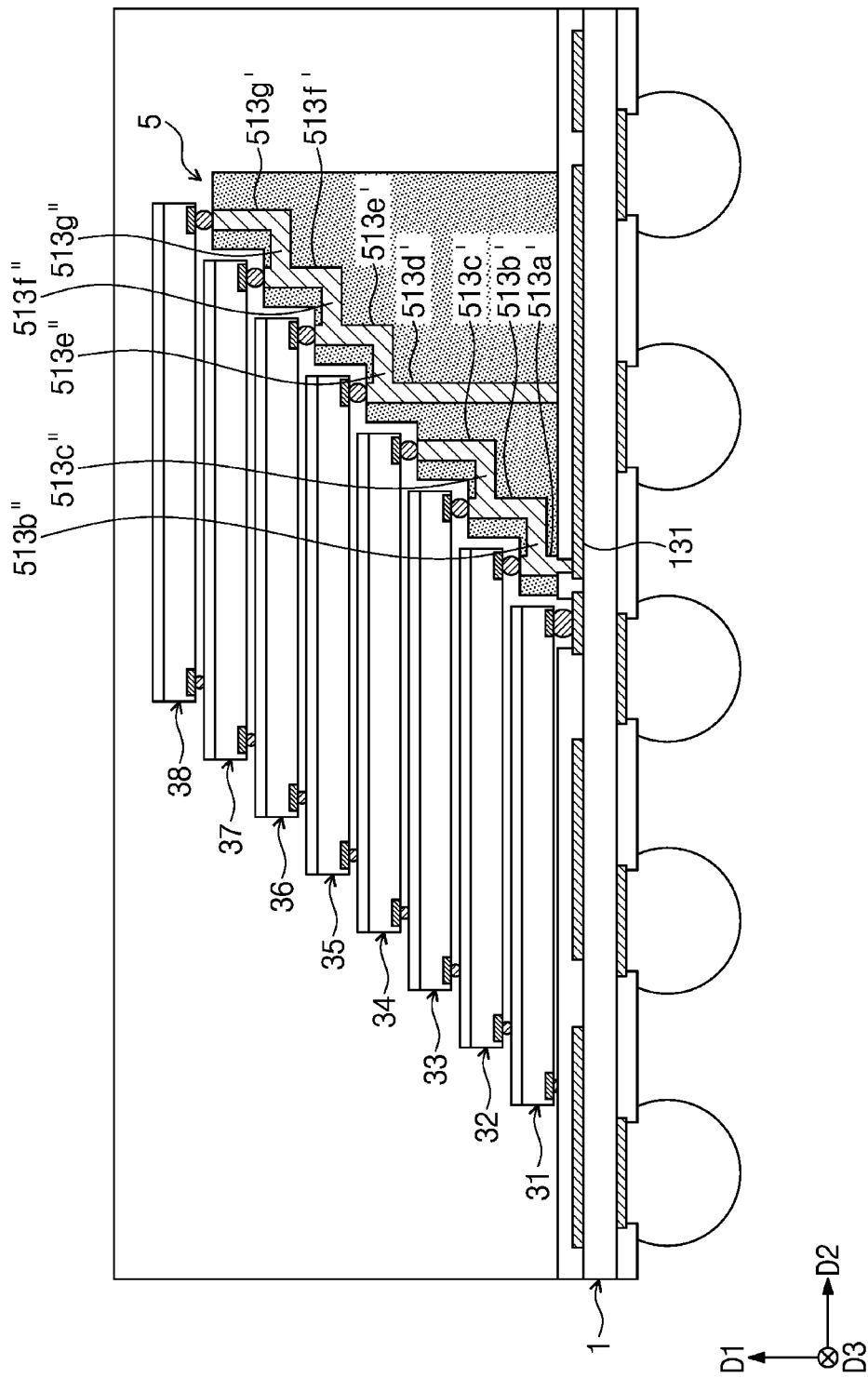
FIG. 13 illustrates a cross-sectional view showing a semiconductor package according to some example embodiments of the present inventive concepts.

FIG. 13 illustrates a cross-sectional view showing a semiconductor package according to some example embodiments of the present inventive concepts.

In the embodiment that follows, components and/or processes substantially identical or similar to those discussed above with reference to FIGS. 1 to 12 will be omitted for convenience of description.

Referring to FIG. 13, the connection structure 5 may include the first to seventh columnar conductors 513a' to 513g', ones of which are connected to each other and others of which are not connected to each other. For example, one or more of the second to seventh connectors 513b" to 513g" may be absent. FIG. 13 shows an example in which the second, third, fifth, sixth, and seventh connectors 513b", 513c", 513e", 513f", and 513g" are present, but the fourth connector (see 513d" of FIG. 12) is absent. The fourth columnar conductor 513d' may be connected to the upper conductive layer 131 of the substrate 1. Each of the second, third, fifth, sixth, and seventh columnar conductors 513b', 513c', 513e', 513f, and 513g' may not be directly connected to the upper conductive layer 131 of the substrate 1. Each of the second and third columnar conductors 513b' and 513c' may be connected through the first columnar conductor 513a' to the upper conductive layer 131 of the substrate 1. Each of the fifth to seventh columnar conductors 513e' to 513g' may be connected through the fourth columnar conductor 513d' to the upper conductive layer 131 of the substrate 1.

The foregoing describes an example in which the first and fourth columnar conductors 513a' and 513d' are directly connected to the upper conductive layer 131, and the other columnar conductors 513b', 513c', 513e', 513f, and 513g' are not directly connected to the upper conductive layer 131, but based on requirements any of the first to seventh columnar conductors 513a' to 513g' may be selected to have a direct connection with the upper conductive layer 131.

Figure 14:
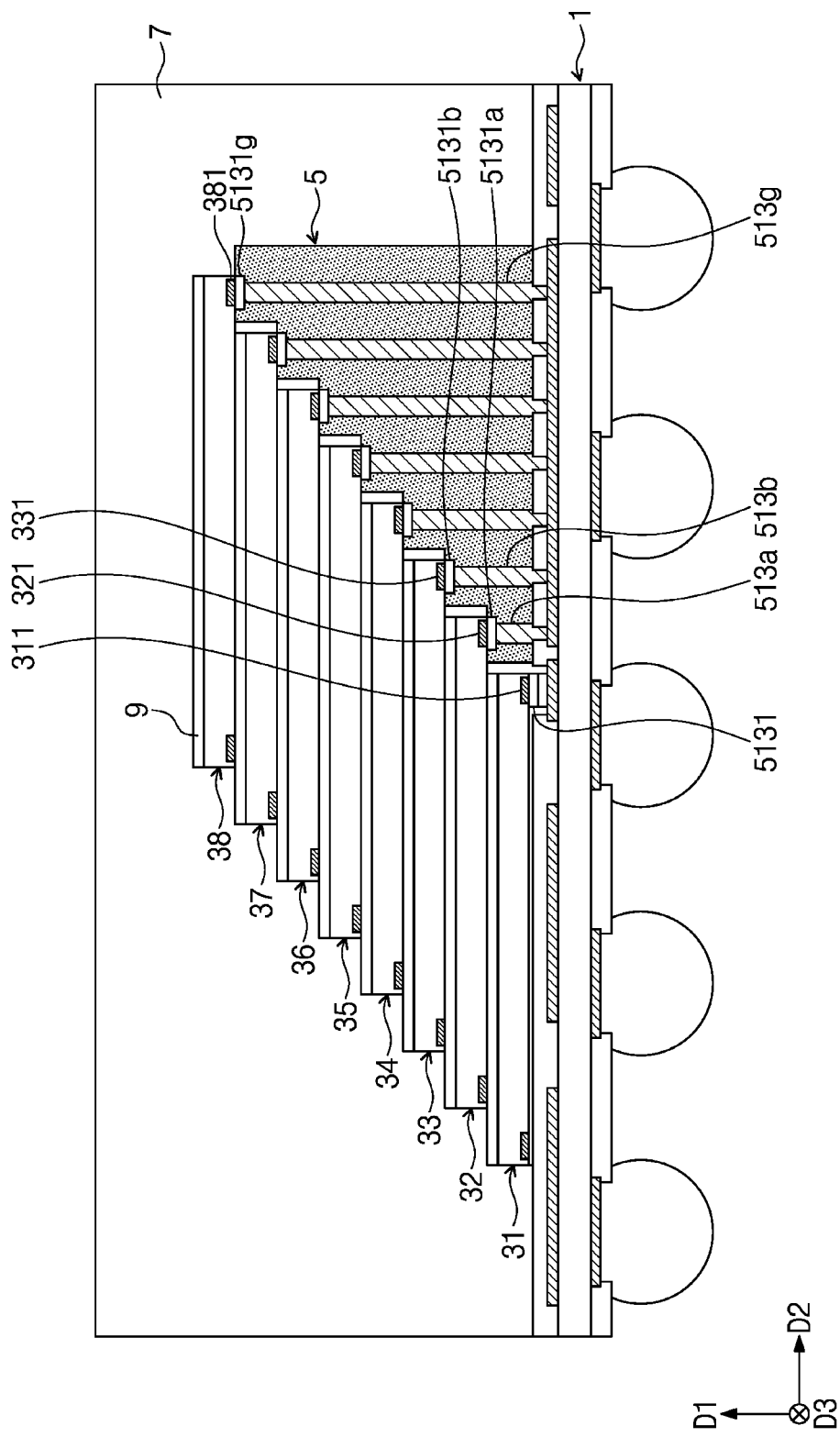
FIG. 14 illustrates a cross-sectional view showing a semiconductor package according to some example embodiments of the present inventive concepts.

FIG. 14 illustrates a cross-sectional view showing a semiconductor package according to some example embodiments of the present inventive concepts.

In the embodiment that follows, components and/or processes substantially identical or similar to those discussed above with reference to FIGS. 1 to 11 will be omitted for convenience of description.

Referring to FIG. 14, the first to seventh columnar conductors 513a to 513g of the connection structure 5 may be directly coupled to corresponding connection pads 321 to 381 of the second to eighth semiconductor chips 32 to 38. The first columnar conductor 513a may include a first columnar conductor end 5131a. The first columnar conductor end 5131a may be exposed at the first surface (see 51a of FIG. 4). The first columnar conductor end 5131a may have a top surface in contact with a bottom surface of the second connection pad 321. The second connection pad 321 may be electrically connected through the first columnar conductor end 5131a to the first columnar conductor 513a. The second columnar conductor 513b may include a second columnar conductor end 5131b. The second columnar conductor end 5131b may be exposed at the second top surface (see 51b of FIG. 4). The second columnar conductor end 5131b may have a top surface in contact with a bottom surface of the third connection pad 331. The third connection pad 331 may be electrically connected through the second columnar conductor end 5131b to the second columnar conductor 513b. The other columnar conductors may be coupled to the other connection pads. A thermocompression process may be performed to couple each of the first to seventh columnar conductor ends 5131a to 5131g to a corresponding one of the second to eighth connection pads 321 to 381.

The second semiconductor chip 32 may be attached to the first semiconductor chip 31 through the adhesive layer 9 coated on the top surface of the first semiconductor chip 31. Each of the other semiconductor chips 33 to 38 may be attached to a corresponding underlying semiconductor chip through an adhesive layer.

Figure 15:
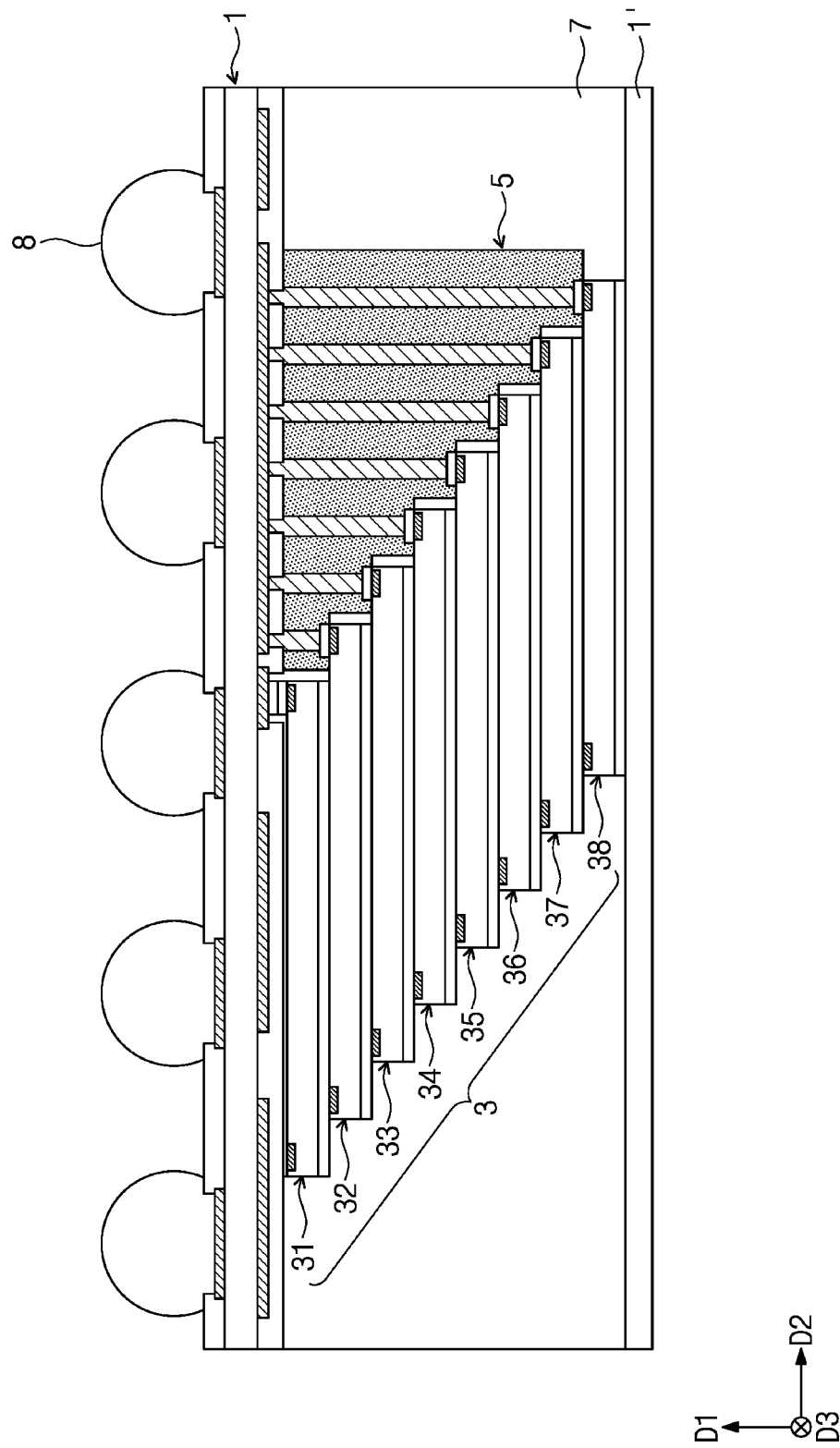
FIG. 15 illustrates a cross-sectional view showing a semiconductor package according to some example embodiments of the present inventive concepts.
Figure 16:
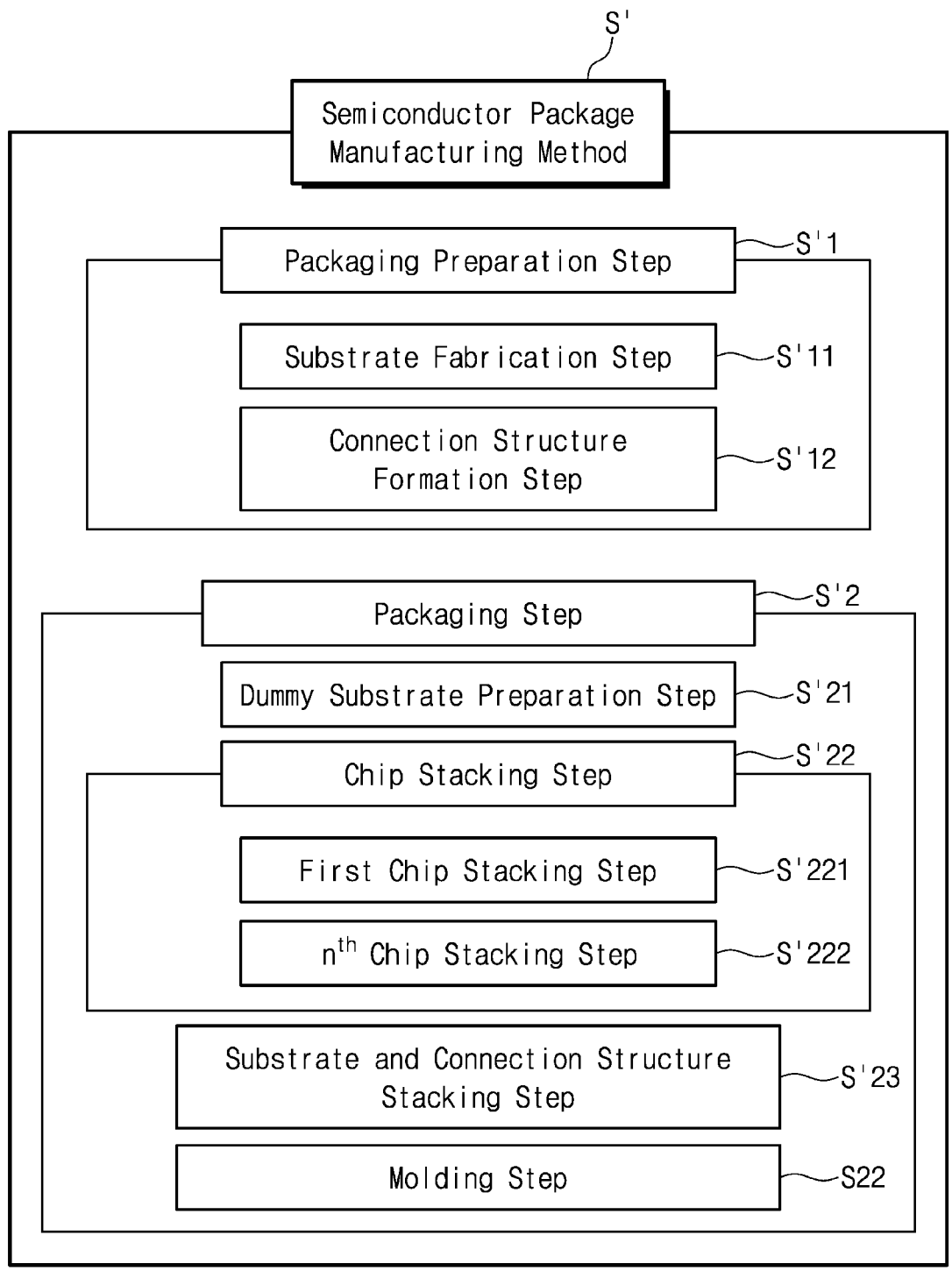
FIG. 16 illustrates a flow chart showing a method of manufacturing the semiconductor package of FIG. 15 according to some example embodiments of the present inventive concepts.

FIG. 15 illustrates a cross-sectional view showing a semiconductor package according to some example embodiments of the present inventive concepts. FIG. 16 illustrates a flow chart showing a method of manufacturing the semiconductor package of FIG. 15 according to some example embodiments of the present inventive concepts.

In the embodiment that follows, components and/or processes substantially identical or similar to those discussed above with reference to FIGS. 1 to 14 will be omitted for convenience of description.

Referring to FIG. 16, a packaging step S'2 may further include a dummy substrate preparation step S'21 and a substrate and connection structure stacking step S'23.

Referring to FIG. 15, at the dummy substrate preparation step S'21, a dummy substrate 1' may be provided. The semiconductor chips 3 may be stacked on the dummy substrate 1'. The semiconductor chips 3 may be stacked in a face-up manner with respect to the dummy substrate 1'. For example, each of the semiconductor chips 3 may be oriented such that its active surface and connection pad are directed up with respect to the dummy substrate 1'. When a chip stacking step S'22 is completed, the substrate and connection structure stacking step S'23 may be performed. The substrate 1 and the connection structure 5 may be placed on the semiconductor chips 3 that are stacked in a face-up manner with respect to the dummy substrate 1'.

Figure 17:
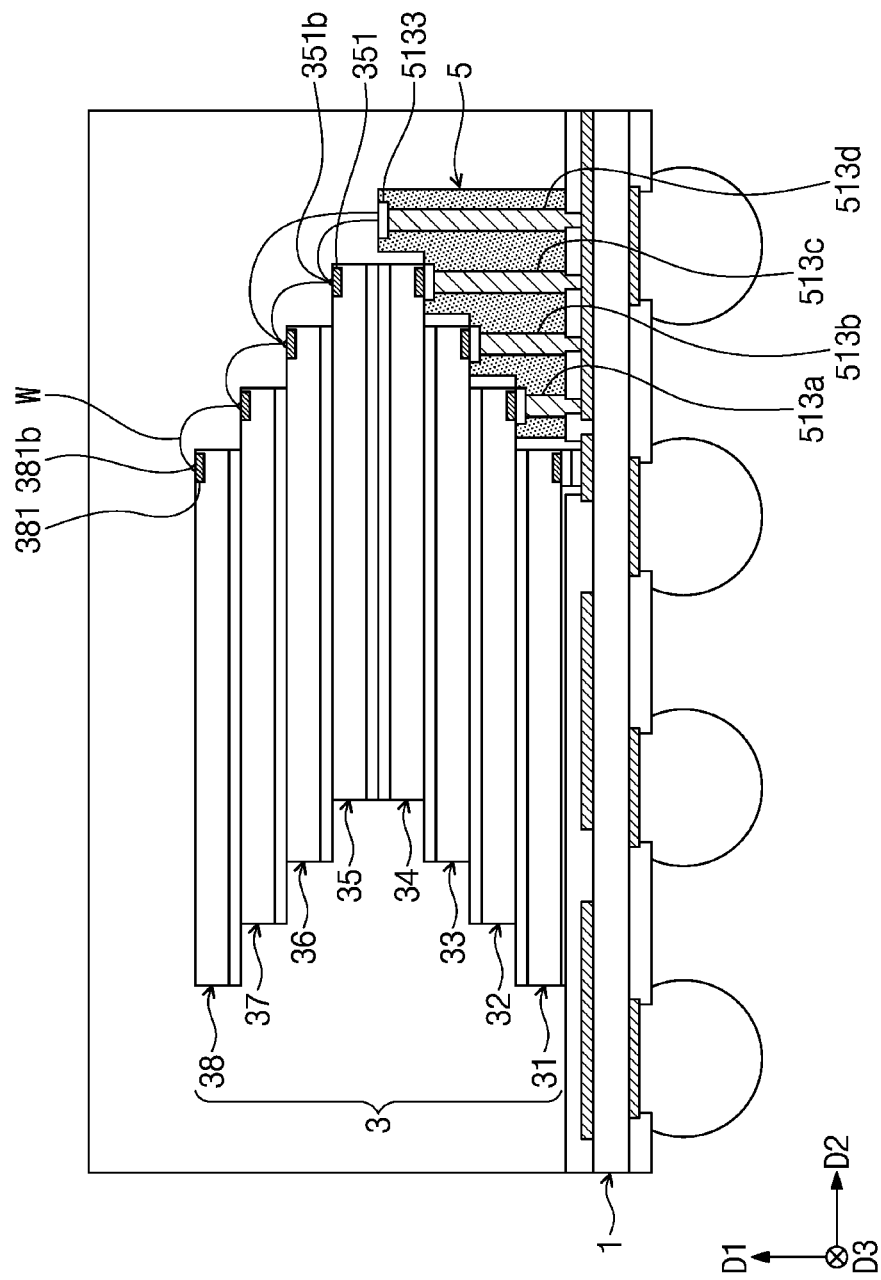
FIG. 17 illustrates a cross-sectional view showing a semiconductor package according to some example embodiments of the present inventive concepts.
Figure 18:
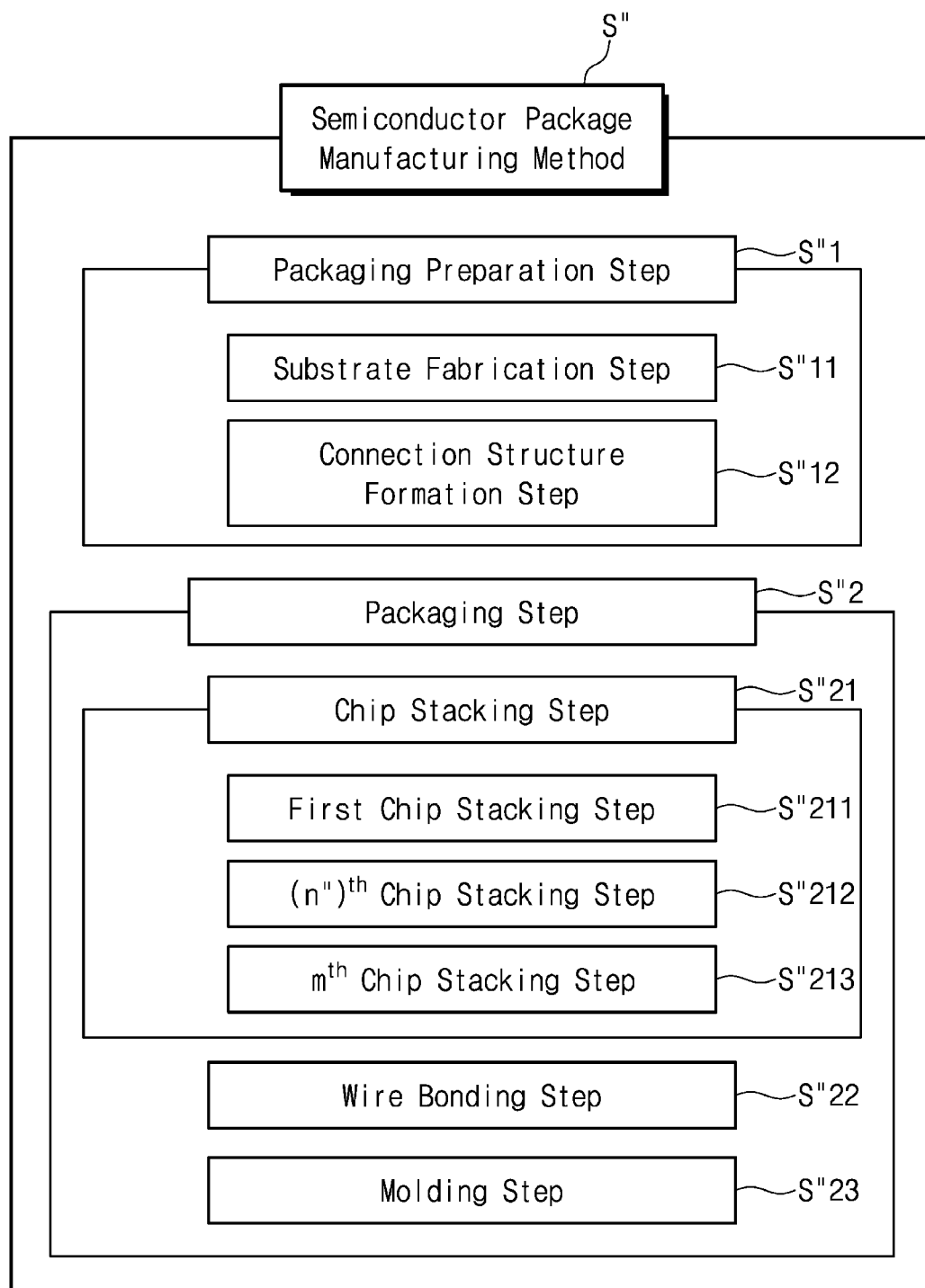
FIG. 18 illustrates a flow chart showing a method of manufacturing the semiconductor package of FIG. 17 according to some example embodiments of the present inventive concepts.

FIG. 17 illustrates a cross-sectional view showing a semiconductor package according to some example embodiments of the present inventive concepts. FIG. 18 illustrates a flow chart showing a method of manufacturing the semiconductor package of FIG. 17 according to some example embodiments of the present inventive concepts.

In the embodiment that follows, components and/or processes substantially identical or similar to those discussed above with reference to FIGS. 1 to 14 will be omitted for convenience of description.

Referring to FIGS. 17 and 18, a packaging step S"2 may include a chip stacking step S"21 and a wire bonding step S"22. The chip stacking step S"21 may include a first chip stacking step S"211, an $(n")^{th}$ chip stacking step S"212, and an $m^{th}$ chip stacking step S"213. The first chip stacking step S"211 may be substantially identical or similar to the first chip stacking step S211 discussed with reference to FIG. 2. The $(n")^{th}$ chip stacking step S"212 may be substantially identical or similar to the $n^{th}$ chip stacking step S212 discussed with reference to FIG. 2.

After the $(n")^{th}$ chip stacking step S"212 is completed, the $m^{th}$ chip stacking step S"213 may be performed such that a first segment of an $m^{th}$ semiconductor chip is directed oppositely in comparison to the $(n")^{th}$ chip stacking step S"212. In the $(n")^{th}$ chip stacking step S"212, the semiconductor chips 31 to 33 may be stacked in a face-down manner in which each of the semiconductor chips 31 to 33 may be oriented such that its active surface and connection pad are directed down with respect to the substrate 1. The $m^{th}$ semiconductor chip may be stacked in a face-up manner with respect to a substrate 1. For example, m may be a natural number between 5 and 8. The eighth semiconductor chip 38 may include the eighth connection pad 381 at a right top end thereof. The eighth connection pad 381 may be coupled to an eighth bonding ball 381b. The eighth bonding ball 381b may be disposed on a top surface of the eighth connection pad 381.

At the wire bonding step S"22, the eighth bonding ball 381b may be coupled to a wire W. The wire W may also be connected either to another bonding ball or to a top end 5133 of the fourth columnar conductor 513d. The fifth to seventh semiconductor chips 35 to 37 may be configured identically or similarly to the eighth semiconductor chip 38.

In the embodiment of FIGS. 17 and 18, the connection structure 5 and the wire W may be simultaneously used for connection between the semiconductor chips 3 and the substrate 1.

Figure 19:
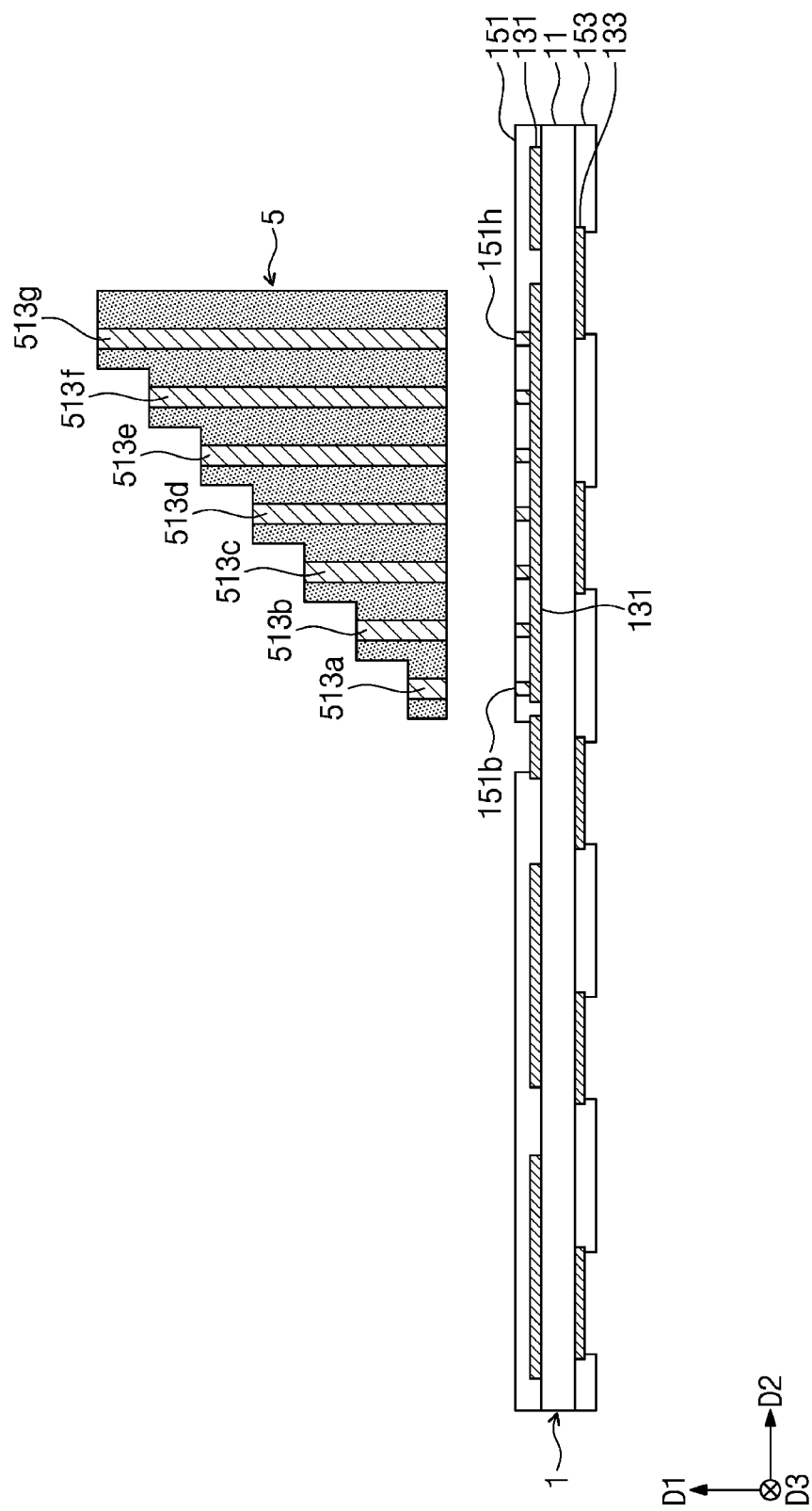
FIG. 19 illustrates a cross-sectional view showing a procedure of assembling a substrate to a connection structure according to some example embodiments of the present inventive concepts.
Figure 20:
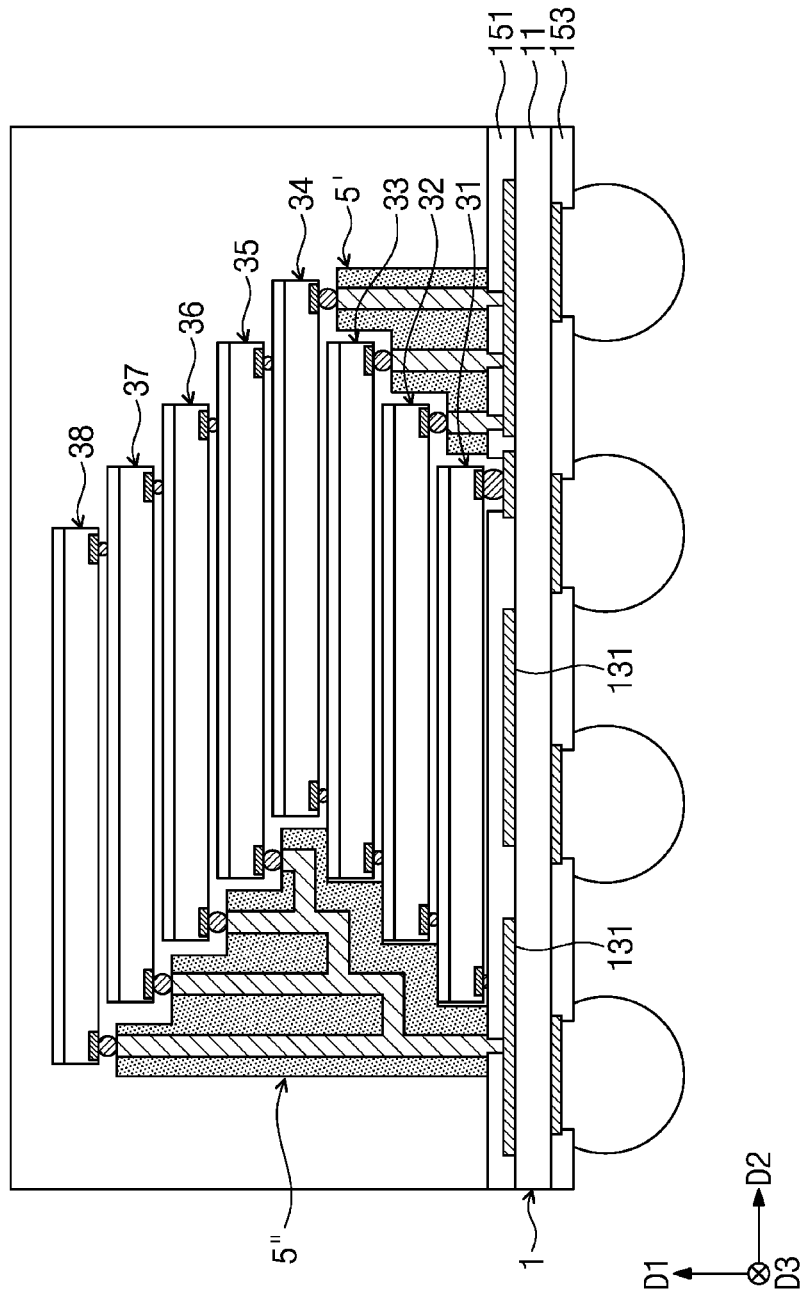
FIG. 20 illustrates a cross-sectional view showing a semiconductor package according to some example embodiments of the present inventive concepts.
Figure 21:
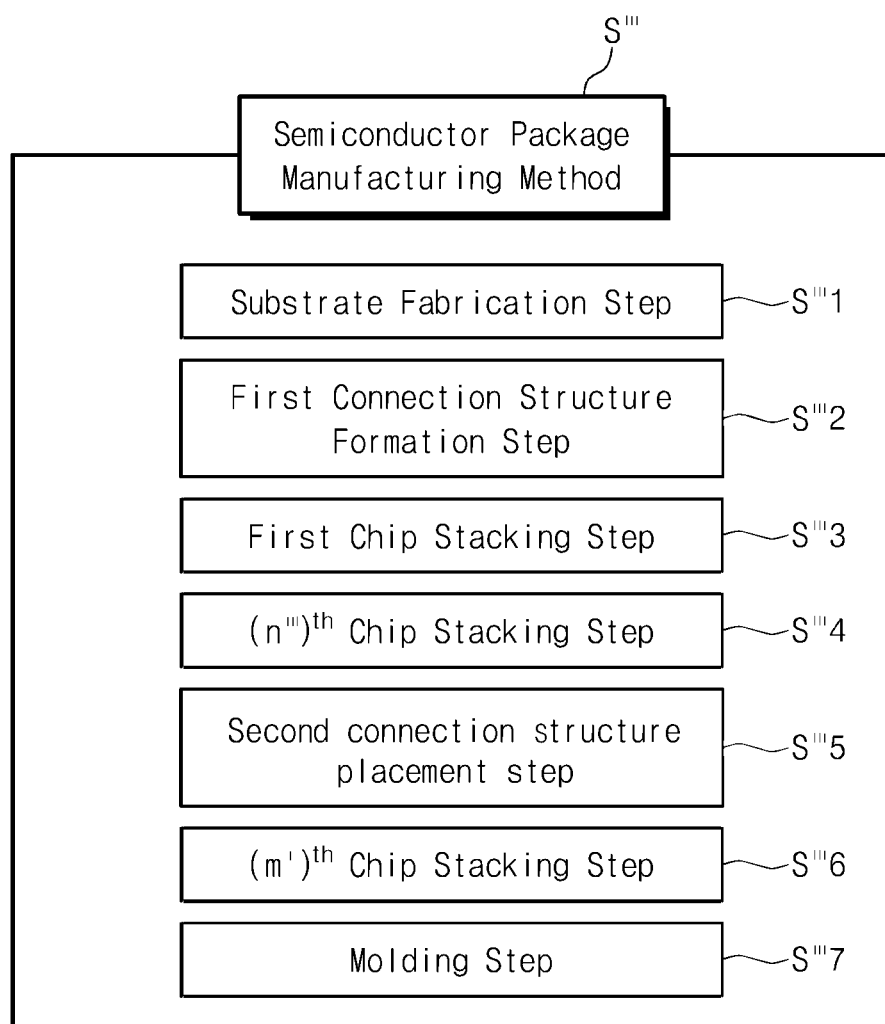
FIG. 21 illustrates a flow chart showing a method of manufacturing the semiconductor package of FIG. 20 according to some example embodiments of the present inventive concepts.

FIGS. 19 and 20 illustrate cross-sectional views showing a semiconductor package according to some example embodiments of the present inventive concepts. FIG. 21 illustrates a flow chart showing a method of manufacturing the semiconductor package of FIG. 20 according to some example embodiments of the present inventive concepts.

In the embodiment that follows, components and/or processes substantially identical or similar to those discussed above with reference to FIGS. 1 to 11 will be omitted for convenience of description.

Referring to FIG. 19, the substrate 1 and the connection structure 5 may be formed individually and separately from each other. After the substrate 1 and the connection structure 5 are formed individually, the connection structure 5 may be assembled to the substrate 1. Various techniques may be used to assemble the substrate 1 and the connection structure 5 to each other. For example, a reflow process or a thermocompression process may be used to couple the first to seventh columnar conductors 513a to 513g of the connection structure 5 to conductive materials filling the second to eighth upper holes 151b to 151h. For another example, the connection structure 5 may be detachably assembled to the substrate 1. In this case, alignment protrusions may be formed on the connection structure 5 and alignment holes may be formed on the substrate 1, and in this case the connection structure 5 and the substrate 1 may be assembled with each other by insertion of the alignment protrusions into the alignment holes. The assembling of the connection structure 5 and the substrate 1 may be performed at the packaging step (see S2 of FIG. 2) or the packaging preparation step (see S1 of FIG. 2).

Referring to FIGS. 20 and 21, a semiconductor package manufacturing method S'" may include a substrate fabrication step S'"1, a first connection structure formation step S'"2, a first chip stacking step S'"3, an $(n''')^{th}$ chip stacking step S'"4, a second connection structure placement step S'"5, an $(m')^{th}$ chip stacking step S'"6, and a molding step S'"7. The substrate fabrication step S'"1, the first connection structure formation step S'"2, and the first chip stacking step S'"3 may be respectively substantially identical or similar to the substrate fabrication step S11, the connection structure formation step S12, and the first chip stacking step S211 that are discussed with reference to FIG. 2. The $(n''')^{th}$ chip stacking step S'"4 may be substantially identical or similar to the $(n")^{th}$ chip stacking step S"212 discussed with reference to FIG. 18.

At the second connection structure placement step S'"5, a second connection structure 5" may be placed on $(n''')^{th}$ semiconductor chips that are stacked at the $(n''')^{th}$ chip stacking step S'"4. In certain embodiments, n''' may be a natural number between 1 and 4. The second connection structure 5" may be in direct contact with, coupled through adhesive layers to, or spaced apart from the $(n''')^{th}$ semiconductor chips. The second connection structure 5'' may be disposed to stand opposite to first segments of the $(n''')^{th}$ semiconductor chips. The second connection structure 5'' may have a stepped structure similar to that of a first connection structure 5' formed at the first connection structure formation step S'''2. At the $(m')^{th}$ chip stacking step S'''6, an $(m')^{th}$ semiconductor chip may be stacked on the second connection structure 5''. For example, m' may be a natural number between 5 and 8.

In accordance with a method of manufacturing a semiconductor package according to some example embodiments of the present inventive concepts, a substrate and a connection structure are formed individually with respect to each other and then assembled with each other and thus the connection structure may be variously changed in shape and position. When the second connection structure 5'' is used as shown in FIG. 20, a stacking direction of semiconductor chips may be changed while the second connection structure 5'' rigidly supports the $(m')^{th}$ semiconductor chip. When the stacking direction is changed from right to left, a semiconductor package may be reduced in size.

Figure 22:
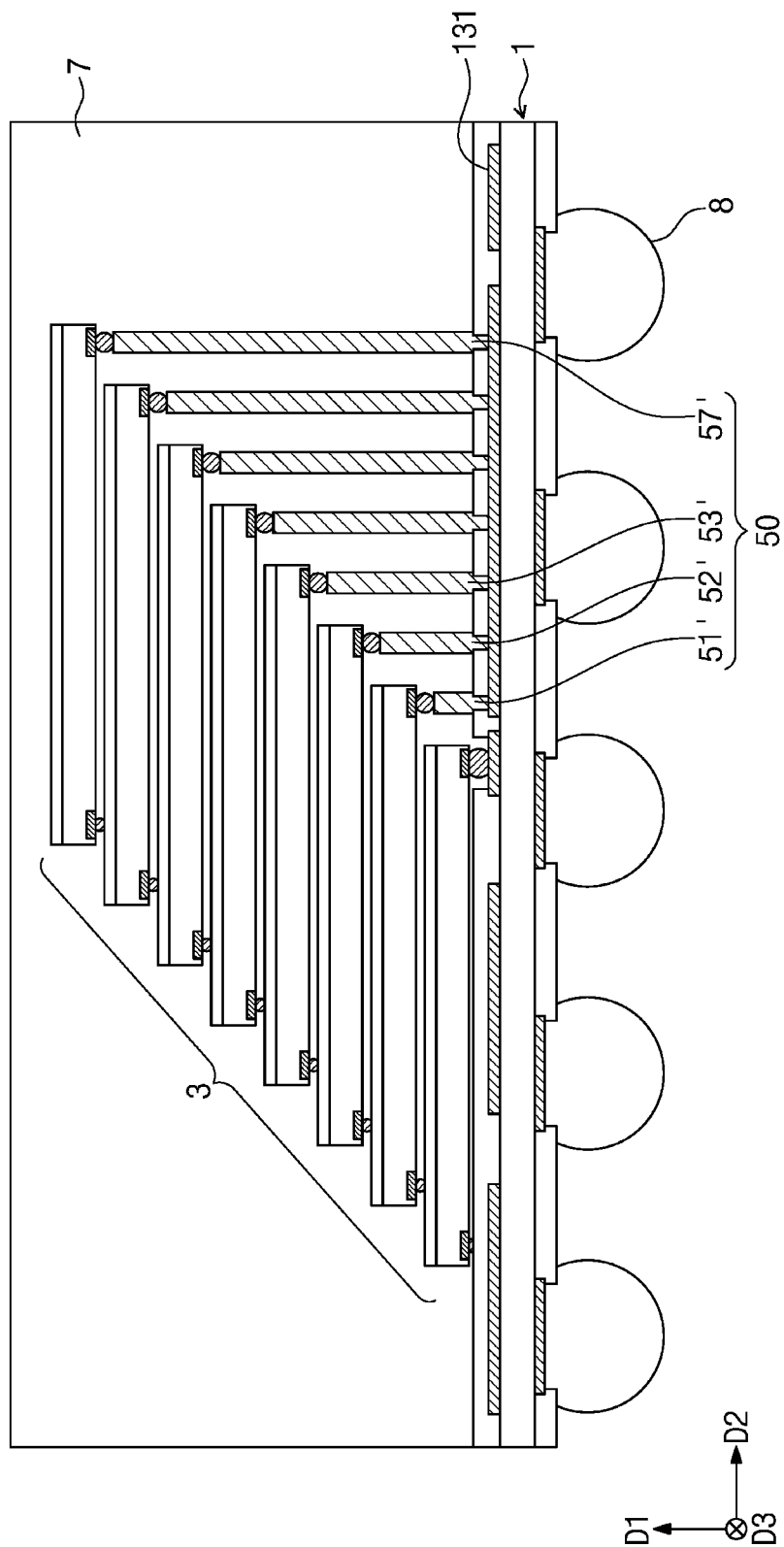
FIG. 22 illustrates a cross-sectional view showing a semiconductor package according to some example embodiments of the present inventive concepts.
Figure 23:
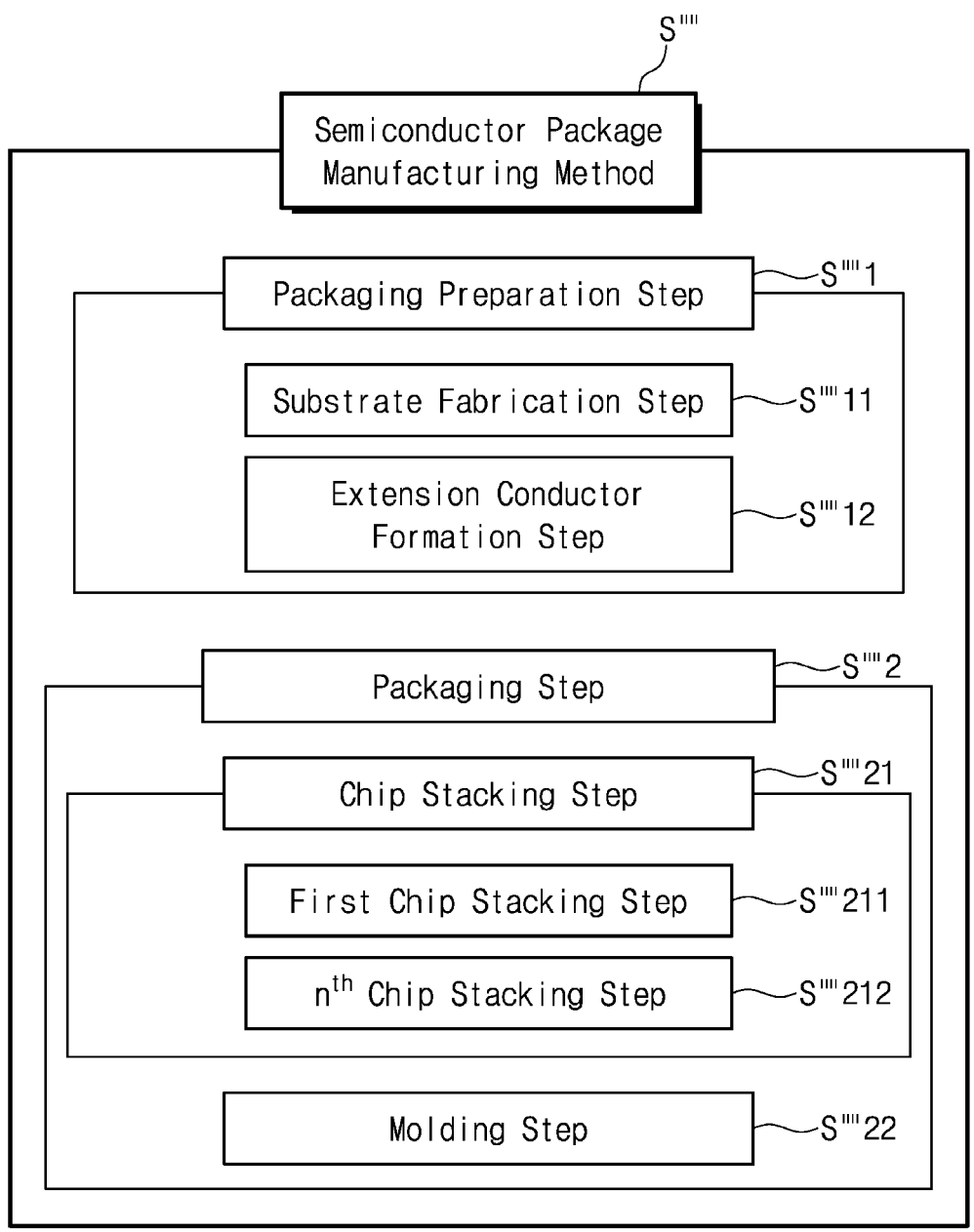
FIG. 23 illustrates a flow chart showing a method of manufacturing the semiconductor package of FIG. 22 according to some example embodiments of the present inventive concepts.

FIG. 22 illustrates a cross-sectional view showing a semiconductor package according to some example embodiments of the present inventive concepts. FIG. 23 illustrates a flow chart showing a method of manufacturing the semiconductor package of FIG. 22 according to some example embodiments of the present inventive concepts.

In the embodiment that follows, components and/or processes substantially identical or similar to those discussed above with reference to FIGS. 1 to 11 will be omitted for convenience of description.

Referring to FIG. 23, a packaging preparation step S'''1 may include an extension conductor formation step S'''12. Referring to FIG. 22, at the extension conductor formation step S'''12, an extension conductor 50 may be formed on the substrate 1. The extension conductor 50 may also be referred to as the columnar conductor described above. The extension conductor 50 may include first to seventh extension conductors 51' to 57'. The first extension conductor 51' may extend upwardly from the upper conductive layer 131. The second semiconductor chip 32 may be disposed on the first extension conductor 51'. The second semiconductor chip 32 may be connected through the first extension conductor 51' to the upper conductive layer 131 of the substrate 1. The second extension conductor 52' may be spaced apart from the first extension conductor 51'. The second extension conductor 52' may have a length greater than that of the first extension conductor 51'. The third to seventh extension conductors 53' to 57' may be configured identically or similarly to the first extension conductor 51' or the second extension conductor 52'. The first to seventh extension conductors 51' to 57' may support a corresponding one of the semiconductor chips 3 and may connect the semiconductor chips 3 to the substrate 1.

According to the present inventive concepts, a semiconductor package may have reduced signal paths.

The semiconductor package may be manufactured at low cost.

The semiconductor package may have low power consumption.

According to a method of manufacturing a semiconductor package of the present inventive concepts, a stress concentration may be avoided to prevent defects of the semiconductor package or chips.

Effects of the present inventive concepts are not limited to the mentioned above, other effects which have not been mentioned above will be clearly understood to those skilled in the art from the following description.

Although the present invention has been described in connection with the embodiments of the present invention illustrated in the accompanying drawings, it will be understood to those skilled in the art that various changes and modifications may be made without departing from the technical spirit and essential feature of the present invention. It therefore will be understood that the embodiments described above are just illustrative but not limitative in all aspects.

What is claimed is:

1. A method of manufacturing a semiconductor package, the method comprising:
   preparing a substrate provided with columnar conductors formed on the substrate; and
   stacking a plurality of semiconductor chips on the substrate such that at least one of the plurality of semiconductor chips is electrically connected to the substrate via the columnar conductors and the plurality of semiconductor chips are disposed outside the columnar conductors,
   wherein the stacking of the plurality of semiconductor chips includes stacking the plurality of semiconductor chip on each other in a vertical direction perpendicular to an upper surface of the substrate, and
   wherein the columnar conductors extend upwardly from the substrate.

2. The method of claim 1, further comprising:
   forming a molding layer to cover the plurality of semiconductor chips.

3. The method of claim 1,
   wherein the stacking of the plurality of semiconductor chips comprises:
     stacking a first semiconductor chip on the substrate; and
     stacking a second semiconductor chip on the first semiconductor chip,
   wherein the second semiconductor chip comprises a first segment that protrudes outwardly beyond one side of the first semiconductor chip, and
   wherein the first segment of the second semiconductor chip comprises a second connection pad on a bottom surface of the first segment, the second connection pad being positioned on the columnar conductors.

4. The method of claim 1, further comprising:
   performing a reflow process or a thermocompression process to bond and electrically connect the plurality of semiconductor chips and the substrate to each other.

5. The method of claim 1,
   wherein the columnar conductors comprise a first columnar conductor and a second columnar conductor,
   wherein the second columnar conductor is horizontally spaced apart from the first columnar conductor,
   wherein the stacking of the plurality of semiconductor chips comprises:
     stacking a first semiconductor chip on the substrate;
     stacking a second semiconductor chip on the first semiconductor chip; and
     stacking a third semiconductor chip on the second semiconductor chip,
   wherein the second semiconductor chip comprises a first segment that protrudes outwardly beyond one side of the first semiconductor chip,
   wherein the third semiconductor chip comprises a first segment that protrudes outwardly beyond one side of the second semiconductor chip, wherein the second semiconductor chip comprises a second connection pad on a bottom surface of the first segment of the second semiconductor chip, the second connection pad being positioned on the first columnar conductor, and wherein the third semiconductor chip comprises a third connection pad on a bottom surface of the first segment of the third semiconductor chip, the second connection pad being positioned on the second columnar conductor.

6. The method of claim 5,
wherein the first columnar conductor and the second columnar conductor are connected to each other through connector extended horizontally between the first columnar conductor and the second columnar conductor.

7. The method of claim 1,
wherein the preparing the substrate provided with the columnar conductors comprise:
  preparing the substrate; and
  forming the columnar conductors on the substrate.

8. The method of claim 7,
wherein the forming the columnar conductors on the substrate comprises:
  forming a connection structure on the substrate; and
  forming the columnar conductors in the connection structure.

9. The method of claim 8,
wherein the forming the columnar conductors in the connection structure comprises:
  forming a hole in the connection structure; and
  forming the columnar conductors in the holes, respectively.

10. The method of claim 9,
wherein the forming the hole in the connection structure is performed by laser drilling or mechanical drilling.

11. The method of claim 8,
wherein the connection structure comprises a first structure and a second structure,
wherein the columnar conductors comprise a first columnar conductor and a second columnar conductor,
wherein the first columnar conductor is positioned in the first structure, and
wherein the second columnar conductor is positioned in the second structure.

12. A method of manufacturing a semiconductor package, the method comprising:
preparing a substrate;
forming a columnar conductor on the substrate; and
stacking a plurality of semiconductor chips on the substrate,
wherein the plurality of semiconductor chips are stacked on each other in a vertical direction perpendicular to an upper surface of the substrate,
wherein the columnar conductor comprises a first columnar conductor extended upwardly from the substrate,
wherein the stacking of the plurality of semiconductor chips comprises:
  stacking a first semiconductor chip on the substrate; and
  stacking a second semiconductor chip on the first semiconductor chip and on the first columnar conductor, wherein the second semiconductor chip comprises a first segment that protrudes outwardly beyond one side of the first semiconductor chip, and wherein the second semiconductor chip comprises a second connection pad on a bottom surface of the first segment of the second semiconductor chip, the second connection pad being electrically connected to the first columnar conductor.

13. The method of claim 12,
wherein the columnar conductor further comprises a second columnar conductor extended upwardly from the substrate and horizontally spaced apart from the first columnar conductor,
wherein the stacking of the plurality of semiconductor chips comprises:
  stacking a third semiconductor chip on the second semiconductor chip and on the second columnar conductor,
wherein the third semiconductor chip comprises a first segment that protrudes outwardly beyond one side of the second semiconductor chip, and
wherein the third semiconductor chip comprises a third connection pad on a bottom surface of the first segment of the third semiconductor chip, the third connection pad being electrically connected to the second columnar conductor.

14. The method of claim 12, further comprising:
forming a molding layer to cover the plurality of semiconductor chips and the columnar conductor on the substrate.

15. The method of claim 12,
wherein the forming the columnar conductor on the substrate comprises:
  forming a connection structure on the substrate; and
  forming the columnar conductor extended upwardly in the connection structure, and
wherein the connection structure comprises an insulation material.

16. The method of claim 15,
wherein the forming the columnar conductor in the connection structure comprises:
  forming a hole in the connection structure; and
  forming the columnar conductor in the hole.

17. The method of claim 12, further comprising:
performing a reflow process or a thermocompression process to bond and electrically connect the plurality of semiconductor chips and the substrate to each other.

18. The method of claim 1,
wherein the plurality of semiconductor chips are the same as each other in area.

19. The method of claim 3,
wherein the stacking of the plurality of semiconductor chips comprises:
  forming a connection structure including a first structure having a first height and a second structure having a second heigh higher than the first height,
wherein a sidewall of the first semiconductor chip is adjacent to a sidewall of the first structure, and
wherein a bottom surface of the second semiconductor chip is disposed on an upper surface of the first structure and a sidewall of the second semiconductor chip is adjacent to a sidewall of the second structure.

* * * * *